(12) United States Patent
Lu et al.

(10) Patent No.: US 9,048,921 B2
(45) Date of Patent: Jun. 2, 2015

(54) RECEIVER FOR WIRELESS COMMUNICATION SYSTEM

(71) Applicant: MediaTek Singapore Pte. Ltd., Singapore (SG)

(72) Inventors: Siu-Chuang Ivan Lu, San Jose, CA (US); George Chien, Saratoga, CA (US); Yen-Horng Chen, Taipei (TW); Chi-Yao Yu, Hsinchu County (TW); Lan-Chou Cho, New Taipei (TW); Chih-Chun Tang, Taipei (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/445,085

(22) Filed: Jul. 29, 2014

(65) Prior Publication Data

US 2014/0335810 A1 Nov. 13, 2014

Related U.S. Application Data

(63) Continuation of application No. 12/835,720, filed on Jul. 13, 2010, which is a continuation-in-part of application No. 12/612,683, filed on Nov. 5, 2009.

(60) Provisional application No. 61/141,847, filed on Dec. 31, 2008, provisional application No. 61/243,602, filed on Sep. 18, 2009, provisional application No. 61/318,840, filed on Mar. 30, 2010.

(51) Int. Cl.
*H04B 1/28* (2006.01)
*H04B 1/10* (2006.01)
(Continued)

(52) U.S. Cl.
CPC .................. *H04B 1/16* (2013.01); *H03F 1/223* (2013.01); *H03F 3/211* (2013.01);
(Continued)

(58) Field of Classification Search
CPC .............. H04B 1/16; H04B 1/18; H04B 1/28; H04B 1/10; H03F 3/193; H03F 3/21; H03F 2200/165; H03F 2200/451; H03F 2200/294; H03F 1/223; H03F 3/45188; H03F 3/45475; H03F 3/72; H03F 3/211; H03F 2203/45386; H03F 2203/7236
USPC ......... 455/307, 130, 333, 293, 330, 313–326, 455/334–340, 290, 424, 425, 296, 302, 286, 455/213, 285; 327/113, 116, 119, 124, 101; 330/171, 182, 197, 302
See application file for complete search history.

(56) References Cited

U.S. PATENT DOCUMENTS 5,678,213 A * 10/1997 Myer .............................. 455/209
6,469,581 B1 * 10/2002 Kobayashi .................... 330/295
(Continued)

*Primary Examiner* — Pablo Tran
(74) *Attorney, Agent, or Firm* — Winston Hsu; Scott Margo

(57) ABSTRACT

One exemplary receiver for a wireless communication system includes signal processing components arranged to generate a receiver output according to a radio frequency (RF) signal. The signal processing components include amplifiers having a class-AB biased amplifier included therein. The signal processing components are disposed in a chip, and the class-AB biased amplifier is an amplifier which processes a signal corresponding to the RF signal before any other amplifier included in the chip. The class-AB biased amplifier has a first amplifier block, a bias circuit and a second amplifier block. The first amplifier block is arranged to receive an input at the input port and generating a first output. The bias circuit is arranged to bias the first amplifier block for a class-AB operation. The second amplifier block is arranged to generate an output at the output port according to the first output.

21 Claims, 21 Drawing Sheets

(51) Int. Cl.
*H04B 1/16* (2006.01)
*H03F 1/22* (2006.01)
*H03F 3/21* (2006.01)
*H03F 3/45* (2006.01)
*H03F 3/72* (2006.01)
*H04B 1/18* (2006.01)
*H03F 3/193* (2006.01)

(52) U.S. Cl.
CPC ....... *H03F 3/45188* (2013.01); *H03F 3/45475* (2013.01); *H03F 3/72* (2013.01); *H03F 2203/45386* (2013.01); *H03F 2203/7236* (2013.01); *H04B 1/18* (2013.01); *H04B 1/28* (2013.01); *H03F 3/193* (2013.01); *H03F 3/21* (2013.01); *H03F 2200/165* (2013.01); *H03F 2200/294* (2013.01); *H03F 2200/451* (2013.01)

(56) References Cited

U.S. PATENT DOCUMENTS

| | | | |
|---|---|---|---|
| 7,205,846 B1* | 4/2007 | Ding et al. | 330/311 |
| 7,460,844 B2* | 12/2008 | Molnar et al. | 455/130 |
| RE41,582 E * | 8/2010 | Larson et al. | 455/250.1 |
| 7,787,847 B2* | 8/2010 | Dijkmans et al. | 455/232.1 |
| 7,890,076 B2* | 2/2011 | Mattisson et al. | 455/323 |
| 8,018,288 B2* | 9/2011 | Duster et al. | 330/311 |
| 8,041,327 B2* | 10/2011 | Youssoufian | 455/307 |
| 8,059,571 B2* | 11/2011 | Sen et al. | 370/311 |
| 8,351,978 B2* | 1/2013 | Tasic et al. | 455/550.1 |
| 2006/0079194 A1* | 4/2006 | Tired et al. | 455/283 |
| 2006/0199562 A1* | 9/2006 | Taylor | 455/333 |
| 2008/0139149 A1* | 6/2008 | Mu et al. | 455/200.1 |
| 2008/0284487 A1* | 11/2008 | Pullela et al. | 327/355 |

* cited by examiner

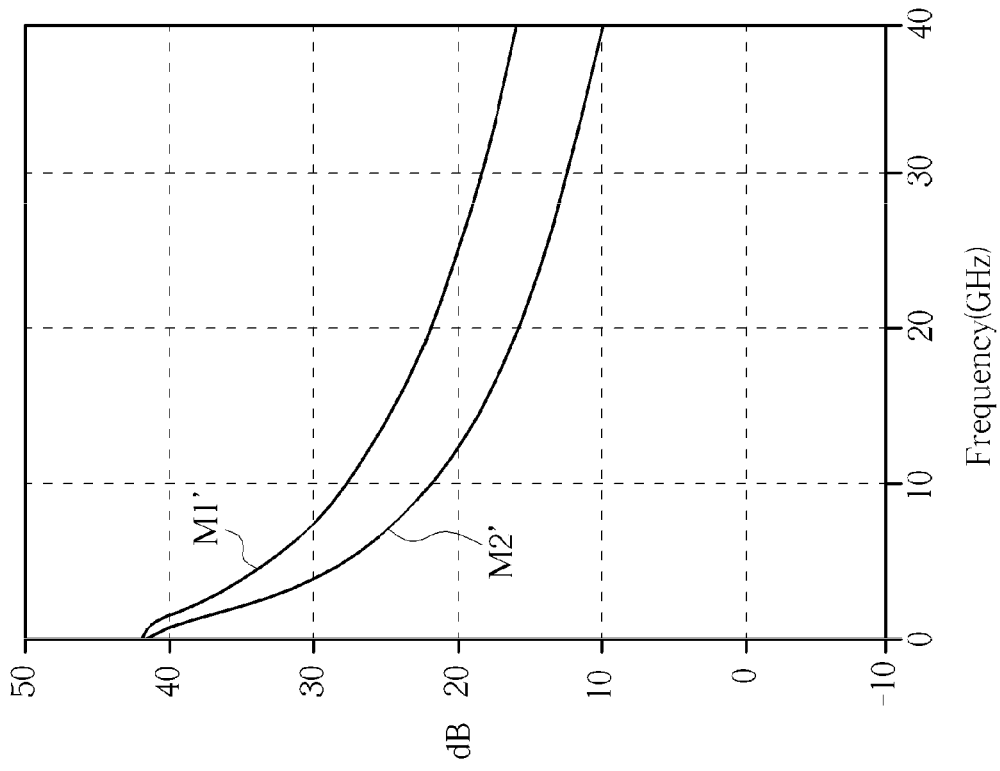
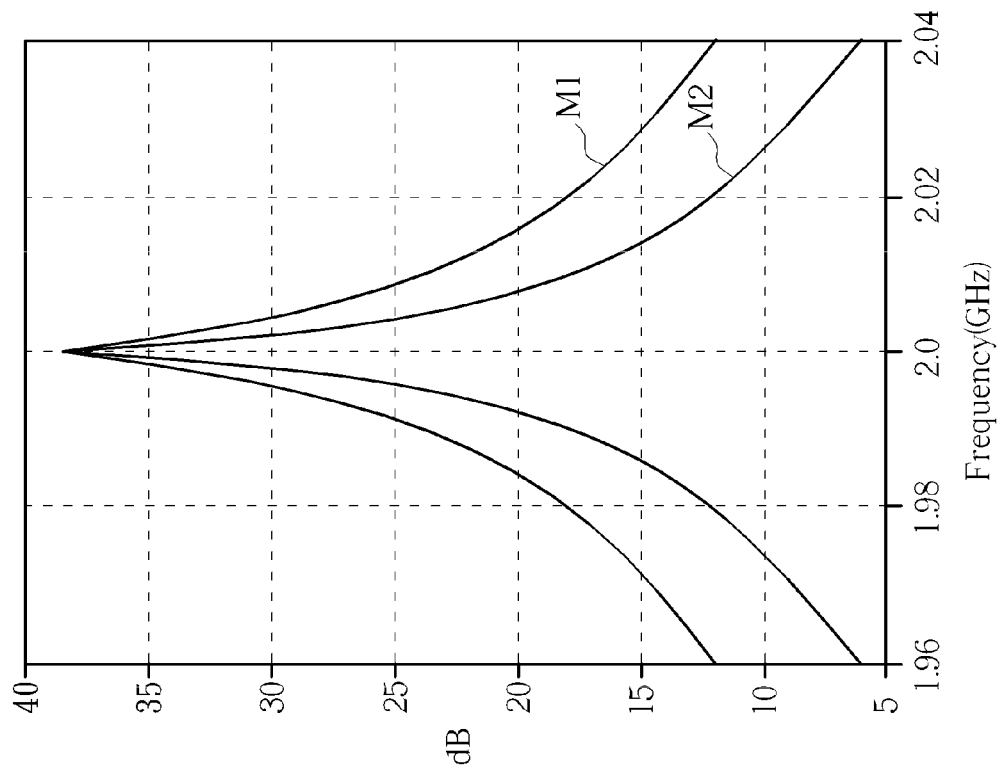
FIG. 6A
FIG. 6B

US 9,048,921 B2

RECEIVER FOR WIRELESS COMMUNICATION SYSTEM

CROSS REFERENCE TO RELATED APPLICATIONS

This is a continuation of co-pending U.S. application Ser. No. 12/835,720 (filed on Jul. 13, 2010), which is a continuation-in-part of co-pending U.S. application Ser. No. 12/612,683 (filed on Nov. 5, 2009). The co-pending U.S. application Ser. No. 12/612,683 further claims the benefit of U.S. provisional application No. 61/141,847 (filed on Dec. 31, 2008). The co-pending U.S. application Ser. No. 12/835,720 further claims the benefit of U.S. provisional application No. 61/243,602 (filed on Sep. 18, 2009) and U.S. provisional application No. 61/318,840 (filed on Mar. 30, 2010). The entire contents of these related applications are incorporated herein by reference.

BACKGROUND

The present invention is related to a receiver for a wireless communication system, and more particularly, to an interference-robust receiver which provides highly linear baseband signal for a wireless communication system and has high dynamic range and improved power efficiency.

An important concern when designing radio-frequency (RF) receivers for wireless communication systems is to detect a very weak in-band signal in the presence of a strong out-of-band jammer. If the linearity of the receiver is not good enough, such jammer may saturate the receiver and block the in-band signal. Using a surface acoustic wave (SAW) filter in front of the receiver is the most common solution to this problem. The SAW filter has band-pass capability with a very high quality (Q) factor, thereby capable of providing a large rejection ratio to the out-of-band jammer (normally greater than 20 dB) and meeting the receiver linearity requirement.

FIG. 1 is a functional diagram illustrating an exemplary prior art receiver 100 for a wireless communication system. The receiver 100 includes a SAW filter 102, an RF signal processor 110, a frequency conversion interface 120, and an analog signal processor 130. The SAW filter 102 is a frequency-selective device which passes in-band part and attenuates out-of-band part of the received RF signal. The RF signal processor 110 includes a matching network 112 for power matching or noise matching and a low noise amplifier (LNA) 114 for signal enhancement. The prior art frequency conversion interface 120 adopts a mixer 126 which operates according to a local oscillator (LO) signal. After signal filtering and amplification, the RF signal is then down-converted to an intermediate frequency signal by the mixer 126. The analog signal processor 130 can thus process the intermediate frequency signal for subsequent applications.

There are several drawbacks associated with the prior art receiver 100. The first is that in-band attenuation tends to make it harder to detect weak signals, creating the need for an even more sensitive receiver after the SAW filter. More importantly, there is currently no economical way to implement SAW filters or their equivalents in the same processes as the active circuits that follow them, which are typically produced using CMOS or BiCMOS processes and either silicon or silicon germanium technologies. The result is that SAW filters significantly increase the cost and consume equally valuable circuit board area in a typical communication device. This problem is further exacerbated by the proliferation of different frequency bands that a communication device has to be compatible with. Moreover, the LNA 114 is operated under a class-A mode, leading to significant power consumption.

SUMMARY OF THE INVENTION

According to a first aspect of the present invention, an exemplary receiver for a wireless communication system is disclosed. The exemplary receiver includes a plurality of signal processing components arranged to generate a receiver output according to a radio frequency (RF) signal. The signal processing components include amplifiers having a class-AB biased amplifier included therein. The signal processing components are disposed in a chip, and the class-AB biased amplifier is an amplifier which processes a signal corresponding to the RF signal before any other amplifier included in the chip.

According to a second aspect of the present invention, an exemplary receiver for a wireless communication system is disclosed. The exemplary receiver includes an RF signal processor and a frequency conversion interface. The RF signal processor is to generate an RF signal, and has a class-AB biased amplifier arranged to apply amplification upon the RF signal. The frequency conversion interface is coupled to the RF signal processor, and used for receiving the RF signal generated from the RF signal processor and generating a down-converted result of the RF signal.

According to a third aspect of the present invention, an exemplary amplifier is disclosed. The exemplary amplifier may be employed in a receiver and includes a first amplifier block, a second amplifier block, a bias circuit, and a switch controller. The first amplifier block is coupled to an input port and an output port of the amplifier, and arranged to amplify an input. The first amplifier block has an input stage arranged to receive the input at the input port of the amplifier. The second amplifier block is coupled to the input port and the output port of the amplifier and arranged to amplify the input. The second amplifier block includes: a first input stage, arranged to receive the input at the input port of the amplifier; and a first switch unit, coupled to the first input stage, wherein the first switch unit selectively couples an output node of the first input stage to the output port of the amplifier or a reference voltage. The bias circuit is coupled to the first amplifier block and the second amplifier block, and used for biasing the first amplifier block and the second amplifier block. The switch controller is coupled to the first switch unit, and used for controlling operation of the first switch unit. When the amplifier enters a first gain mode, the bias circuit applies a class-A bias to each of the input stage in the first amplifier block and the first input stage in the second amplifier block, and the switch controller controls the first switch unit to couple the output node of the first input stage to the reference voltage.

According to a fourth aspect of the present invention, an exemplary amplifier is disclosed. The exemplary amplifier includes a first amplifier block, a second amplifier block, a bias circuit, and a switch controller. The first amplifier block is coupled to an input port and an output port of the amplifier and arranged to amplify an input. The first amplifier block has an input stage arranged to receive the input at the input port of the amplifier. The second amplifier block is coupled to the input port and the output port of the amplifier and arranged to amplify the input. The second amplifier block includes: a plurality of input stages, each arranged to receive the input at the input port of the amplifier; and a plurality of switch units, respectively coupled to the input stages, wherein each of the switch unit controls a connection of an output node of a corresponding input stage. The bias circuit is coupled to the first amplifier block and the second amplifier block, and used for biasing the first amplifier block and the second amplifier block. The switch controller is coupled to the switch units, and used for controlling operation of the switch units. When an input power of the input exceeds a predetermined level, the bias circuit applies a class-A bias to each of the input stage in the first amplifier block and the input stages in the second amplifier block, the switch controller controls the switch units to disconnect output nodes of the input stages in the second amplifier block from the output port of the amplifier, and at least one input stage in the second amplifier block is disabled by at least one switch unit controlled by the switch controller.

According to a fifth aspect of the present invention, an exemplary amplifier is disclosed. The exemplary amplifier includes a first amplifier block, a second amplifier block, a bias circuit, and a switch controller. The first amplifier block is coupled to an input port and an output port of the amplifier and arranged to amplify an input. The first amplifier block has a first input stage arranged to receive the input at the input port of the amplifier. The second amplifier block is coupled to the input port and the output port of the amplifier. The second amplifier block includes: a second input stage, arranged to receive the input at the input port of the amplifier; and a switch unit, coupled to the second input stage and arranged to control a connection of an output node of the second input stage. The bias circuit is coupled to the first amplifier block and the second amplifier block, and used for biasing the first amplifier block and the second amplifier block. The switch controller is coupled to the switch unit, and used for controlling operation of the switch unit. When an input power of the input exceeds a predetermined level, the bias circuit applies a class-AB bias to each of the first input stage and the second input stage, and the second input stage in the second amplifier block is disabled by the switch unit controlled by the switch controller.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 6A and 6B are diagrams illustrating the operation of the frequency conversion interface according to the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
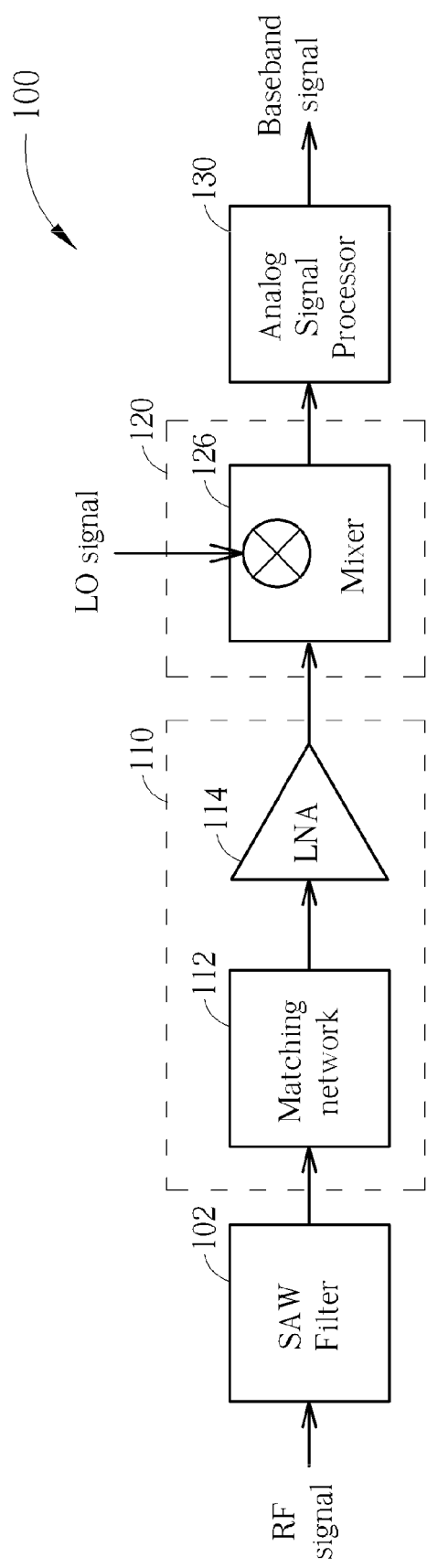
FIG. 1 is a functional diagram illustrating an exemplary prior art receiver for a wireless communication system.
Figure 2A:
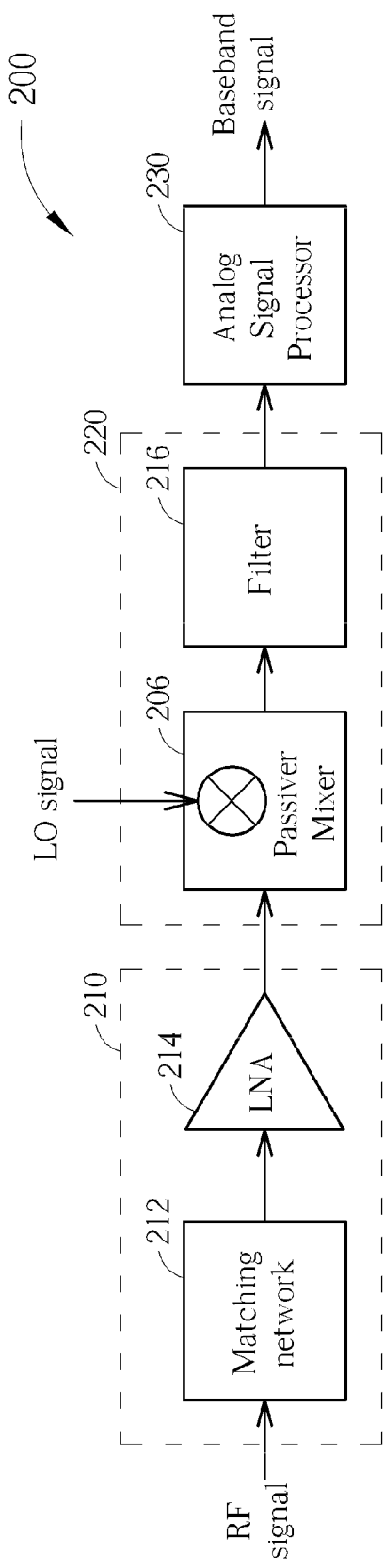
FIGS. 2A and 2B are functional diagrams illustrating an interference-robust receiver for a wireless communication system according to the present invention.
Figure 2B:
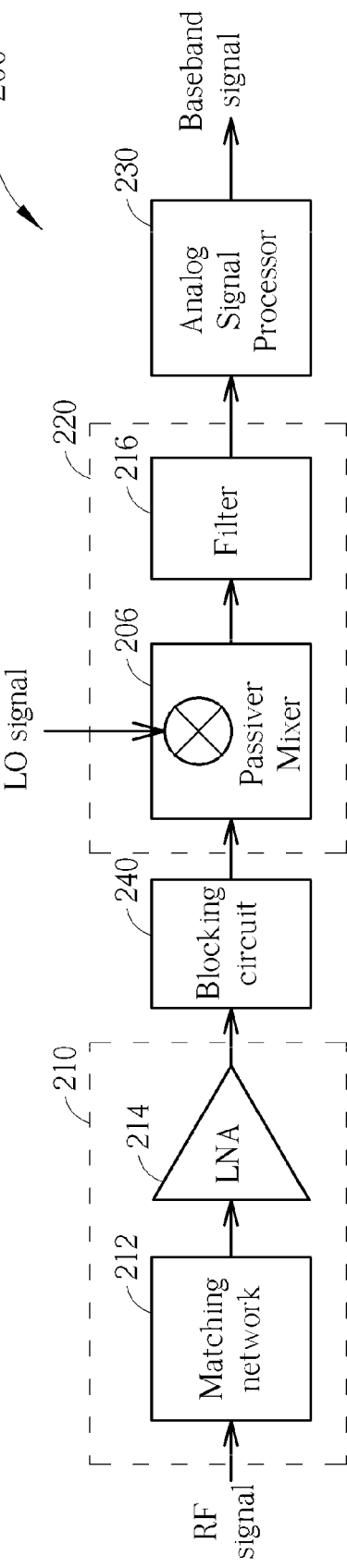

FIGS. 2A and 2B are functional diagrams illustrating an interference-robust receiver 200 for a wireless communication system according to the embodiments of the present invention. The receiver 200 depicted in FIGS. 2A and 2B, each including an RF signal processor 210, a frequency conversion interface 220 and an analog signal processor 230, can receive a wideband RF signal and down-convert the wideband RF signal to a predetermined intermediate frequency. The receiver 200 depicted in FIG. 2B further includes a blocking circuit 240 for direct current (DC) signal isolation between the RF signal processor 210 and the frequency conversion interface 220. The RF signal processor 210 can adopt many configurations, such as using a matching network 212 and an LNA 214 for providing the RF signal to the frequency conversion interface 220. The matching network 212 provides power or noise matching in order to improve power gain or noise figure depending the system requirement in various applications or circuit designs. The LNA 214 then amplifies the RF signal for better driving the frequency conversion interface 220. In the embodiments of the present invention, the LNA 214 can be a pseudo-differential, LNA, a single-ended LNA, a fully differential LNA, or other suitable LNA circuits. If required, the matching network 212 can also provide signal conversion, such as converting a single-ended RF signal into a differential pair RF signal if the LNA 214 adopts differential input ports.

The frequency conversion interface 220 comprises a passive mixer 206 and a filter 216. The passive mixer 206, which operates according to the LO signal, down-converts the RF signal provided by the RF signal processor 210 to a predetermined intermediate frequency, thus obtaining an intermediate frequency signal. Moreover, the in-band part and out-of-band part of the RF signal are down-converted to the passband and the stopband of the filter 216, respectively. In one application, the passband of the filter 216 can be designed to a frequency range centered on the frequency of the LO signal. Yet in other applications, the passive mixer 206 can be arranged so that the in-band part of the RF signal is away from the frequency of the LO signal. That is, depending on design requirements, the in-band part of the RF signal can be within or not within a certain range of frequencies centered on the frequency of the LO signal, not limited by the embodiments.

Meanwhile, the filter 216 provides signal rejection by passing the input signal when the frequency is in its passband and blocking the input signal when the frequency is in its stopband. Since the in-band part and the out-of-band part of the RF signal are respectively down-converted to the passband and the stopband of the filter 216 by the passive mixer 206, substantially only the in-band intermediate frequency signal is transmitted to the analog signal processor 230, thereby preventing the analog signal processor 230 from being saturated by the unwanted jammer intermediate frequency signal (i.e., the down-converted out-of-band RF signal). In other words, the frequency conversion interface 220 is operated as a current driven interface to the RF signal processor 210 for the out-of-band part of the RF signal.

In another aspect, the filter 216 suppresses the voltage swing of the jammer intermediate frequency signal at its input. As a passive device, the passive mixer 206 also up-converts the voltage established at the input of the filter 216. Therefore, as the voltage established at the input of the filter 216 is suppressed by the filter 216, the voltage established at the input of the passive mixer 206 can also be suppressed, thereby preventing the RF signal processor 210 from being saturated by the out-of-band part of the RF signal. The RF signal processor 210 can comprise any type of amplifier (e.g. a transconductance amplifier) to provide an RF signal to the frequency conversion interface 220. In the embodiments, the filter 216 may be a passive filter, which can be consisting of all passive components or comprise passive and active components, operated as a passive device.

Figure 3A:
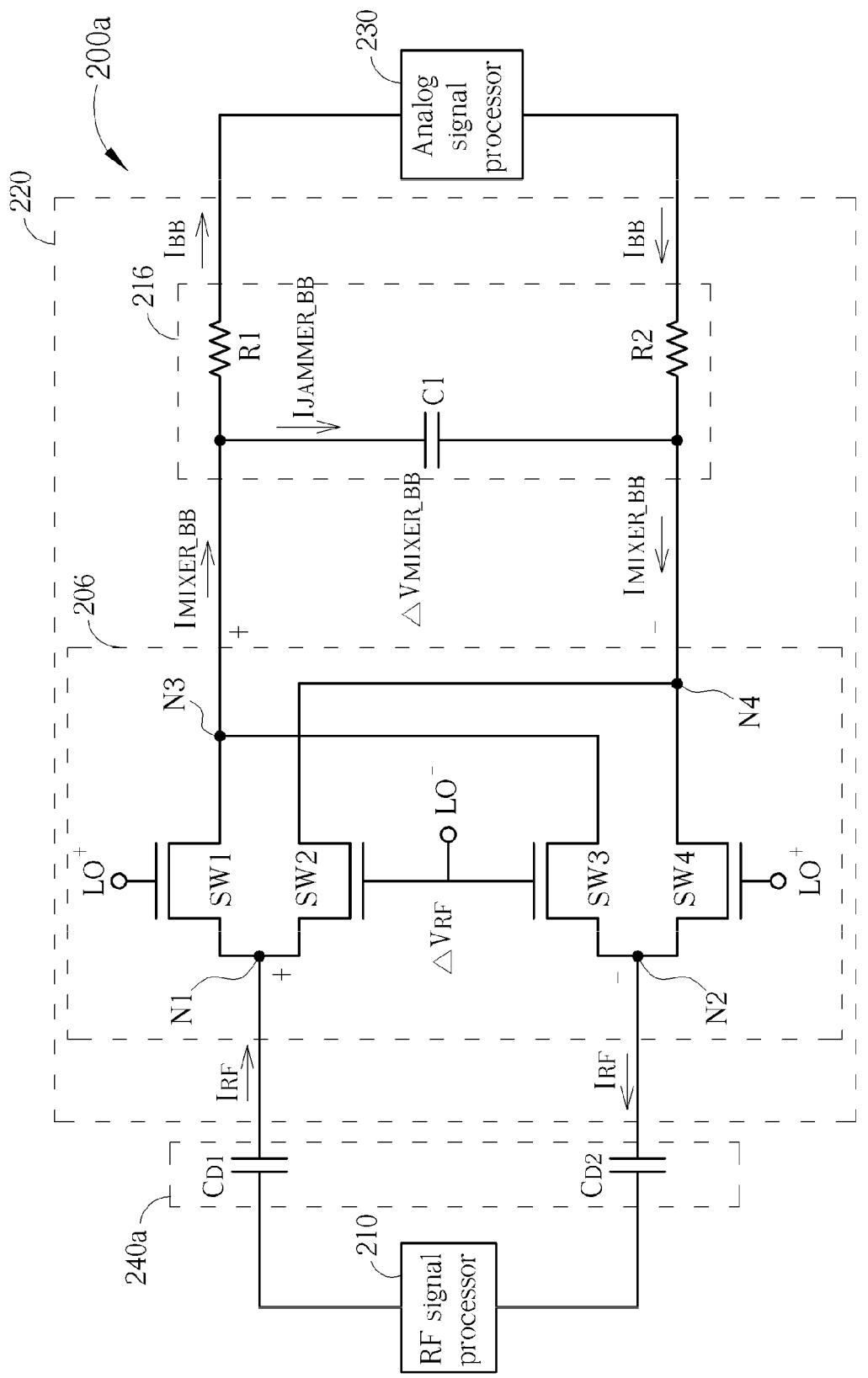
FIGS. 3A, 3B, and 4-5 are circuit diagrams illustrating the embodiments of the receiver in FIG. 2B.
Figure 3B:
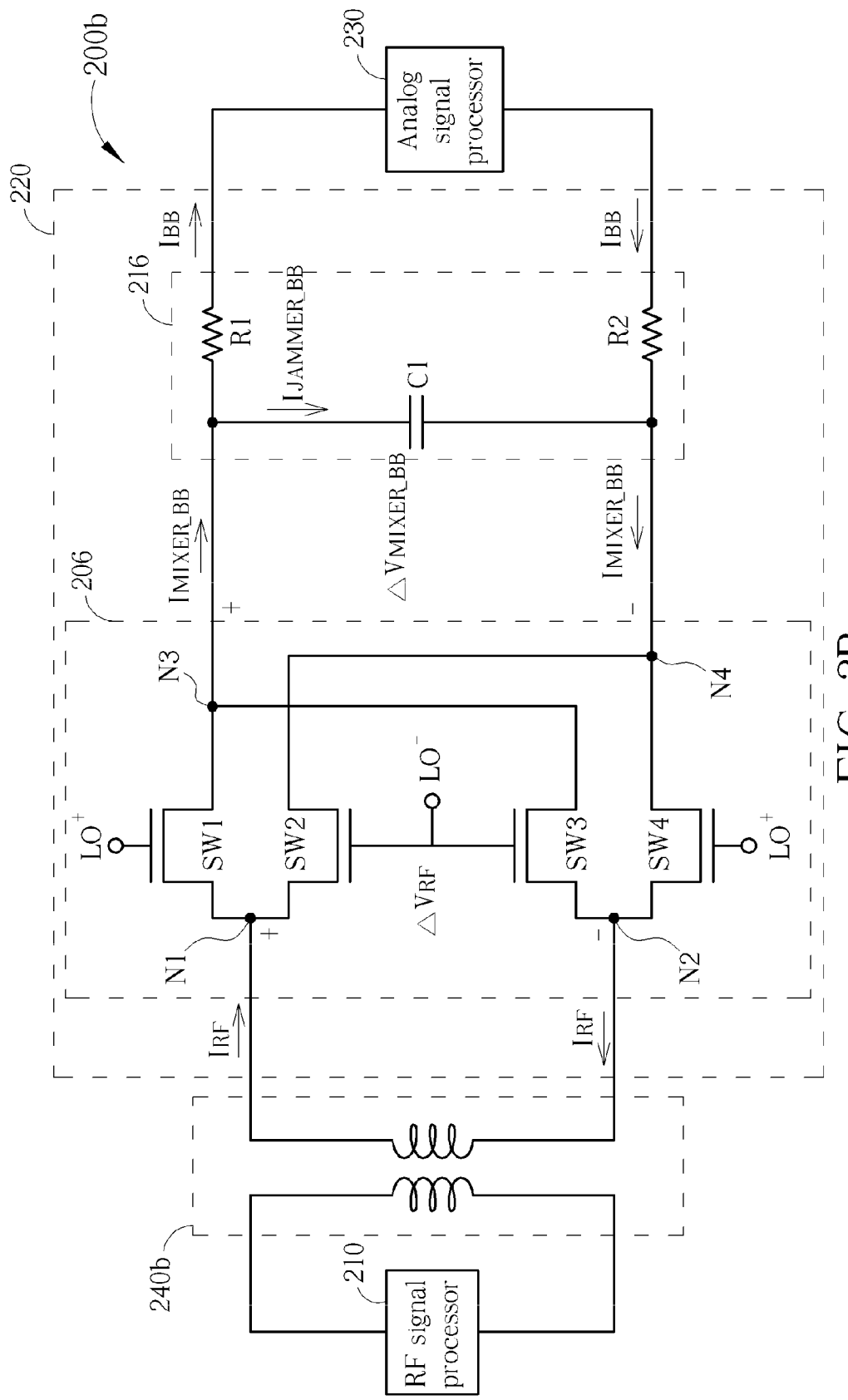

FIGS. 3A, 3B and 4-5 are circuit diagrams illustrating the embodiments of the receiver 200 in FIG. 2B. In the receiver 200a according to the first embodiment of the present invention as depicted in FIG. 3A, the passive mixer 206 includes four switches SW1-SW4, the filter 216 is a resistor-capacitor (RC) type current-input current-output low-pass filter having a capacitor C1 and two resistors R1 and R2, and the blocking circuit 240a includes two capacitors $C_{D1}$ and $C_{D2}$. In the receiver 200b according to the first embodiment of the present invention as depicted in FIG. 3B, the passive mixer 206 includes four switches SW1-SW4, the filter 216 is an RC type current-input current-output low-pass filter having a capacitor C1 and two resistors R1 and R2, and the blocking circuit 240b includes a transformer. The passive mixer 206 receives the RF signal (represented by a current $I_{RF}$ flowing into a first input node N1 and out of a second input node N2) and outputs the intermediate frequency signal (represented by a current $I_{MIXER\_BB}$ flowing out of a first output node N3 and into a second output node N4). In the blocking circuit 240a, the capacitor $C_{D1}$ is disposed between the RF signal processor 210 and the first input node N1, while the capacitor $C_{D2}$ is disposed between the RF signal processor 210 and the second input node N2 for DC isolation. In the blocking circuit 240b, a transformer is provided for DC isolation. The switches SW1-SW4 operate according to a differential local oscillator signal pair LO+ and LO−, wherein the negative differential local oscillator signal LO− has a 180 degree phase shift with respect to the positive differential local oscillator signal LO+: the switch SW1 selectively connects/disconnects the first input node N1 to the first output node N3 depending on the positive local oscillator signal LO+, the switch SW2 selectively connects/disconnects the first input node N1 to the second output node N4 depending on the negative local oscillator signal LO−, the switch SW3 selectively connects/disconnects the second input node N2 to the first output node N3 depending on the negative local oscillator signal LO−, the switch SW4 selectively connects/disconnects the second input node N2 to the second output node N4 depending on the positive local oscillator signal LO+. Therefore, the switches SW1-SW4 can mix the RF signal $I_{RF}$ with the differential local oscillator signal pair LO+ and LO−. For example, the RF signal $I_{RF}$ having a frequency of ($f_{LO}+\Delta f$) is down-converted to the intermediate frequency signal $I_{MIXER\_BB}$ having a frequency of $\Delta f$ by the passive mixer 206. Thus, the in-band RF signal at ($f_{LO}+\Delta f_1$) and the out-of-band RF signal at ($f_{LO}+\Delta f_2$) both are down-converted to $\Delta f_1$ to $\Delta f_2$ respectively. The down-converted in-band and out-of-band RF signal are denoted by $I_{BB}$ and $I_{JAMMER\_BB}$ respectively.

In the case of $\Delta f_1 < \Delta f_2$, the corner frequency of the low-pass filter ($1/4\pi R_1 C_1$) should be designed between $\Delta f_1$ and $\Delta f_2$ such that the down-converted in-band RF signal $I_{BB}$ is in the passband of the low-pass filter 216 and is outputted to the analog signal processor 230 via the resistors R1 and R2, while the down-converted out-of-band RF signal $I_{JAMMER\_BB}$ is in the stopband of the low-pass filter 216 and is filtered by the capacitor C1, thereby preventing the analog signal processor 230 from being saturated by the jammer intermediate frequency signal $I_{JAMMER\_BB}$.

Meanwhile, the intermediate-frequency voltage swing $\Delta V_{MIXER\_BB}$ is irresistibly established between the nodes N3 and N4. As a passive device, the passive mixer 206 simultaneously up-converts the intermediate-frequency voltage swing $\Delta V_{MIXER\_BB}$ to an RF voltage $\Delta V_{RF}$ between the nodes N1 and N2. If the corner frequency of the low-pass filter 216 is much smaller than $\Delta f_2$ (e.g. 10 times), the intermediate-frequency voltage swing $\Delta V_{MIXER\_BB}$ at $\Delta f_2$ is approximately equal to $I_{JAMMER\_BB}/2\pi \Delta f_2 C_1$. Therefore, the intermediate frequency voltage swing $\Delta V_{MIXER\_BB}$ due to the out-of-band RF signal, which is established between the nodes N3 and N4, can be suppressed by increasing the capacitance of the capacitor $C_1$ in the filter 216, while the RF voltage $\Delta V_{RF}$ established between the nodes N1 and N2 can also be suppressed with the same ratio, thereby preventing the RF signal processor 210 from being saturated by the RF voltage $\Delta V_{RF}$ resulted from the out-of-band RF signal.

Figure 4:
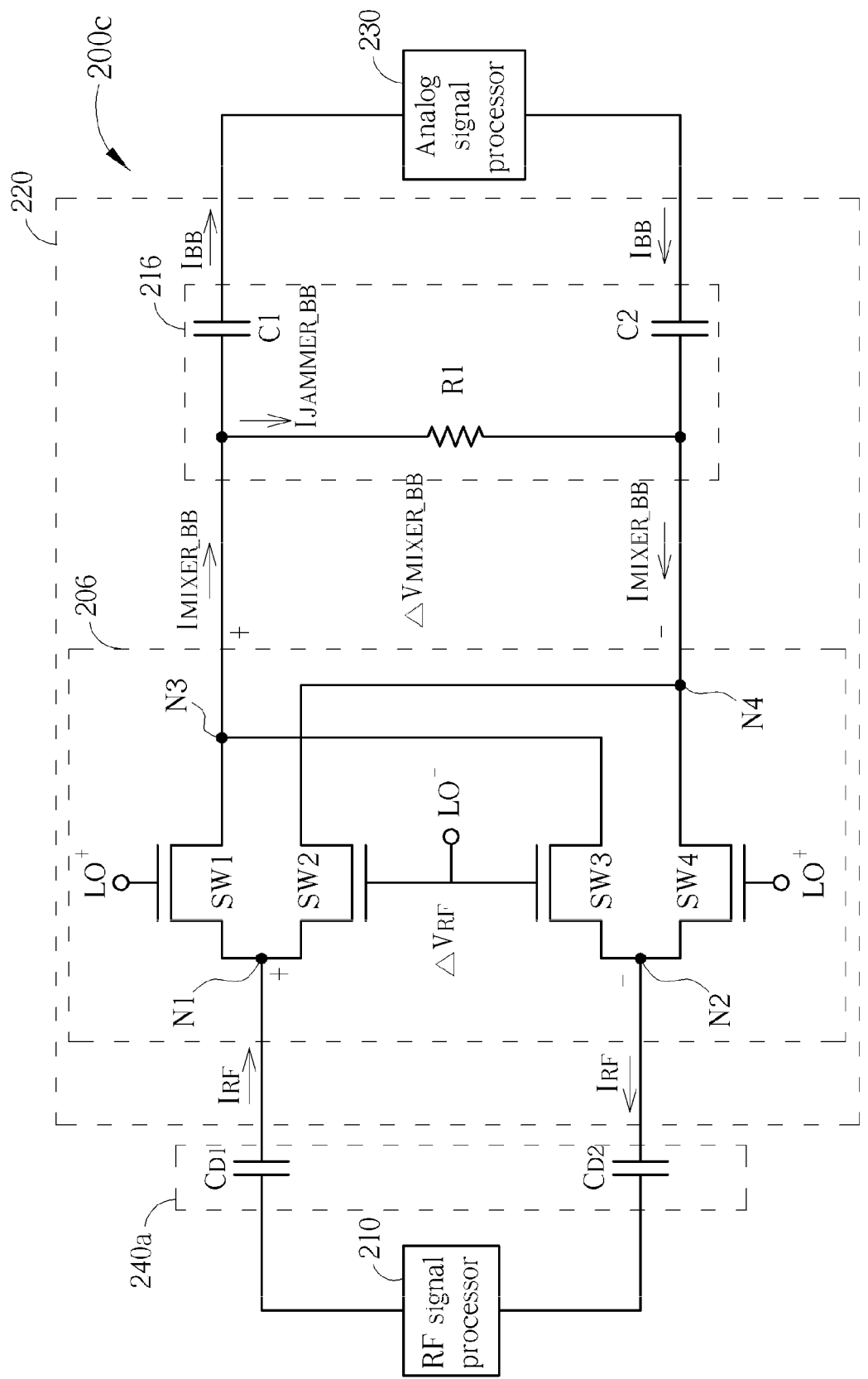

In the receiver 200c according to the second embodiment of the present invention as depicted in FIG. 4, the filter 216 is a current-in current-out high-pass RC filter having a resistor R1 and two capacitors C1 and C2. In this example, $\Delta f_1$ is larger than $\Delta f_2$, so the frequency corners of the high-pass filter ($1/\pi R_1 C_1$ and $1/\pi R_1 C_2$) should be designed between $\Delta f_1$ and $\Delta f_2$ such that the down-converted in-band RF signal $I_{BB}$ is in the passband of the high-pass filter 216 and is outputted to the analog signal processor 230 via the capacitors C1 and C2, while the down-converted out-of-band RF signal $I_{JAMMER\_BB}$ is in the stopband of the high-pass filter 216 and is filtered by the resistor R1, thereby preventing the analog signal processor 230 from being saturated by the jammer intermediate frequency signal $I_{JAMMER\_BB}$.

If the corner frequency of the high-pass filter 216 is much larger than $\Delta f_2$ (e.g. 10 times), the intermediate-frequency voltage swing $\Delta V_{MIXER\_BB}$ at $\Delta f_2$ is approximately equal to $I_{JAMMER\_BB} * R_1$. Therefore, the intermediate frequency voltage swing $\Delta V_{MIXER\_BB}$ due to the out-of-band RF signal, which is established between the nodes N3 and N4, can be suppressed by decreasing the resistance of the resistor $R_1$ in the filter 216, while the RF voltage $\Delta V_{RF}$ established between the nodes N1 and N2 can also be suppressed with the same ratio, thereby preventing the RF signal processor 210 from being saturated by the RF voltage $\Delta V_{RF}$ resulted from the out-of-band RF signal. Meanwhile, the receiver 200c can also adopt the blocking circuit 240b as depicted in FIG. 3B.

Figure 5:
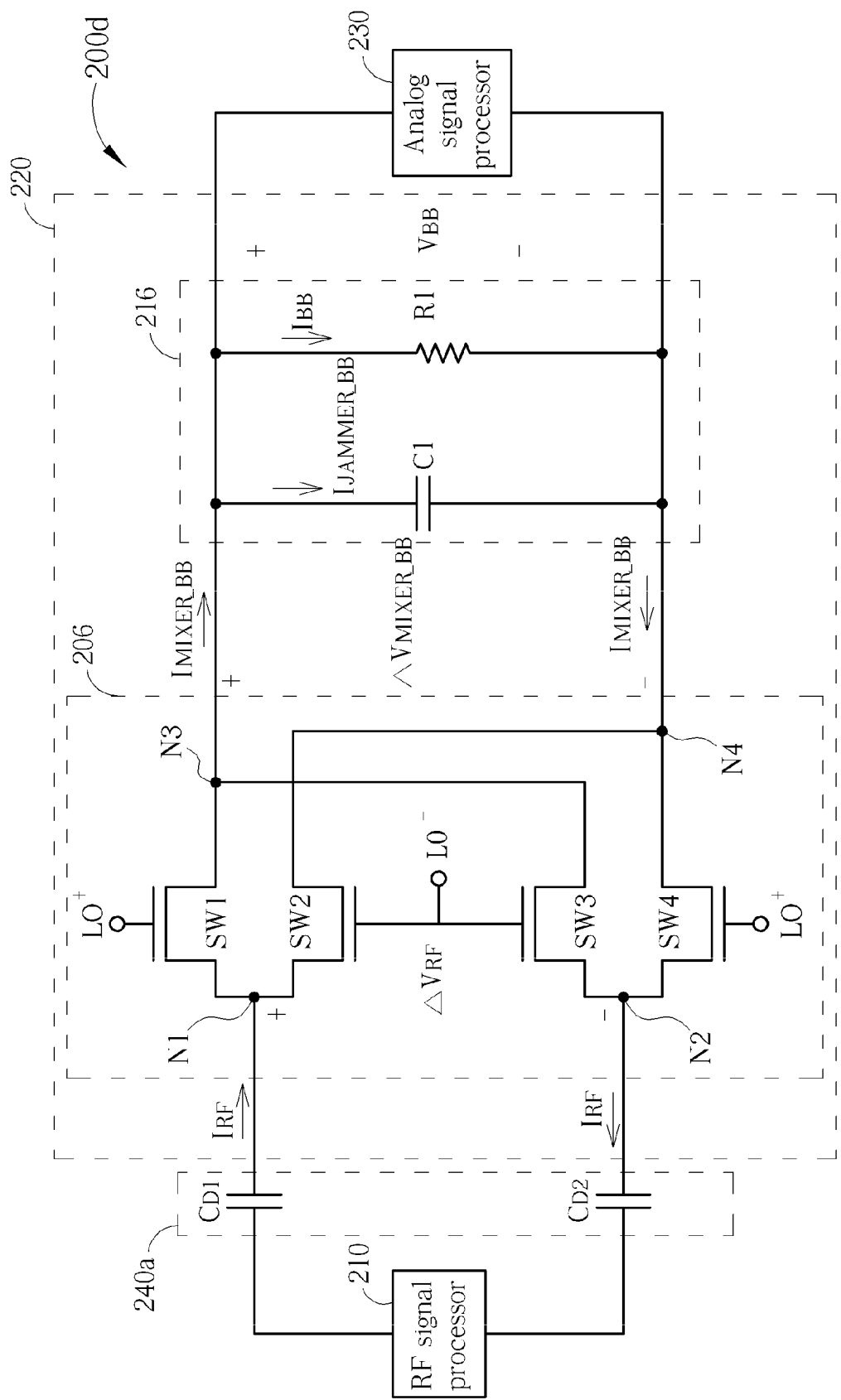

In the receiver 200d according to the third embodiment of the present invention as depicted in FIG. 5, the filter 216 is a current-in voltage-out low-pass RC filter having a resistor R1 and a capacitor C1. In the case of $\Delta f_1 < \Delta f_2$, the corner frequency of the low-pass filter ($1/2\pi R_1 C_1$) should be designed between $\Delta f_1$ and $\Delta f_2$ such that the down-converted in-band RF signal $I_{BB}$ is in the passband of the low-pass filter 216. Thus, the in-band intermediate-frequency voltage swing between the nodes N3 and N4, outputted to the analog signal processor 230, is approximately equal to $I_{BB} * R_1$. In another aspect, the down-converted out-of-band RF signal $I_{JAMMER\_BB}$ is in the stopband of the low-pass filter 216 so the out-of-band intermediate-frequency voltage between N3 and N4 is approximately equal to $I_{JAMMER\_BB}/2\pi\Delta_2 C_1$. Therefore, the intermediate-frequency voltage swing $\Delta V_{MIXER\_BB}$ at $\Delta f_2$ due to the out-of-band RF signal can be suppressed by increasing the capacitance of the capacitor C1 in the filter 216. In this example, suppressing the intermediate-frequency voltage swing $\Delta V_{MIXER\_BB}$ at $\Delta f_2$ due to the out-of-band RF signal can prevent the analog signal processor 230 from being saturated. As in the previous two examples, the voltage swing $\Delta V_{RF}$ established between the nodes N1 and N2 can also be suppressed with the same ratio, thereby preventing the RF signal processor 210 from being saturated by the RF voltage $\Delta V_{RF}$ resulted from the out-of-band RF signal. Meanwhile, the receiver 200d can also adopt the blocking circuit 240b as depicted in FIG. 3B.

FIGS. 6A and 6B are diagrams illustrating the operation of the frequency conversion interface 220 according to the present invention. FIG. 6A shows the input impedance of the passive mixer 206, while FIG. 6B shows the frequency response of the filter 216. Curves M1 and M1' represent the results when the filter 216 provides an equivalent resistance of 100 ohm and an equivalent capacitance of 400 pF, while Curves M2 and M2' represent the results when the filter 216 provides an equivalent resistance of 100 ohm and an equivalent capacitance of 800 pF. As can be seen in FIGS. 6A and 6B, the out-of-band rejection ratio, or equivalently, the out-of-band voltage swing suppression, can be determined by properly selecting the values for the capacitor(s) and the resistor(s) of the filter 216.

Figure 7:
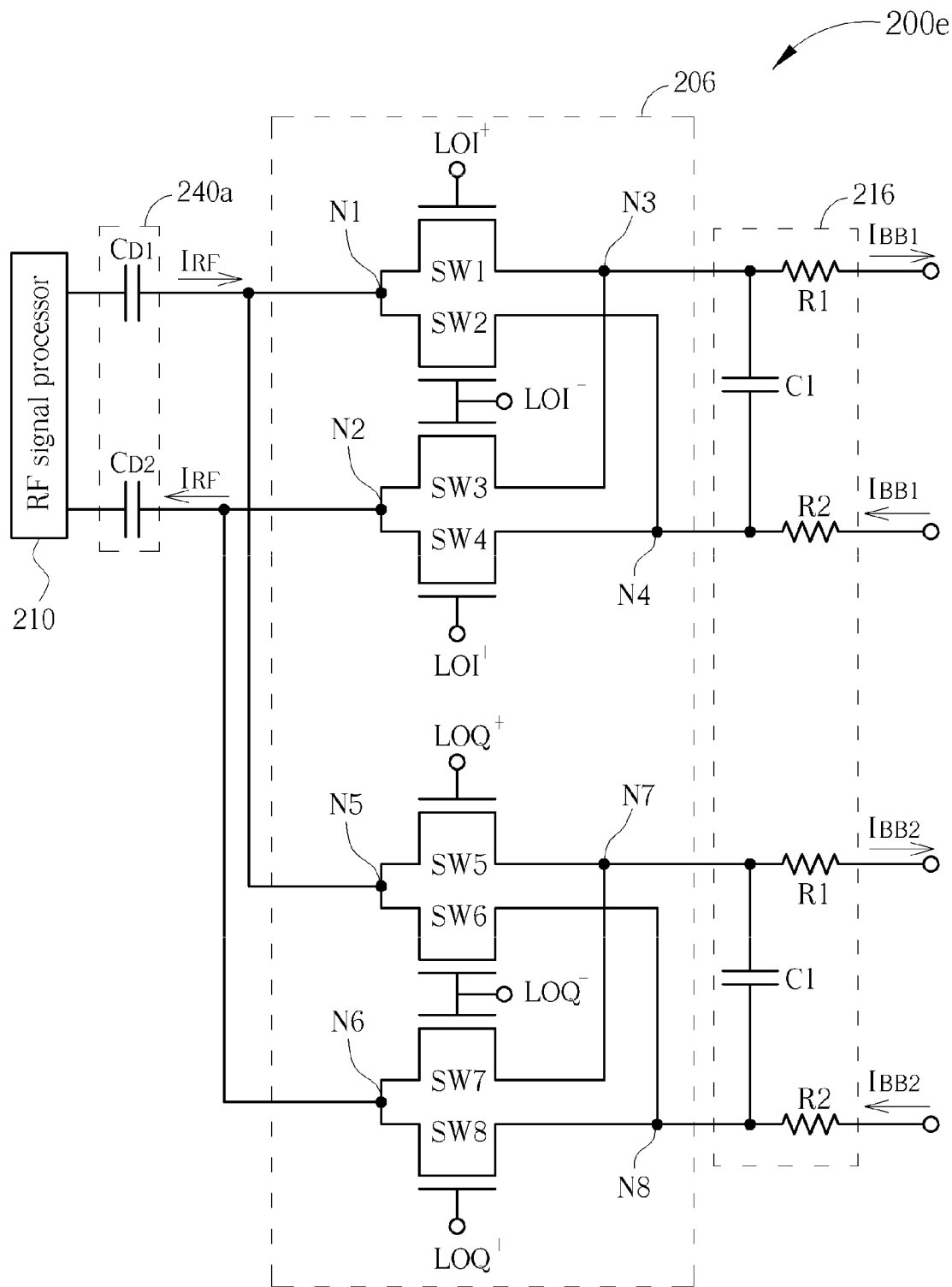
FIG. 7 is a circuit diagram illustrating another embodiment of the receiver depicted in FIG. 2B.

FIG. 7 is a circuit diagram illustrating a fifth embodiment of the receiver 200 depicted in FIG. 2B. In the receiver 200e according to the fifth embodiment of the present invention, the passive mixer 206 includes eight switches SW1-SW8 and the blocking circuit 240a includes two capacitors $C_{D1}$ and $C_{D2}$. The passive mixer 206 receives the RF signal (represented by a current $I_{RF}$ flowing into and out of the passive mixer) at a first input node N1 and a second input node N2, as well as at a third input node N5 and a fourth input node N6. Also, the passive mixer 206 outputs the intermediate frequency signal at a first output node N3 and a second output node N4, as well as at a third output node N7 and a fourth output node N8. The capacitor $C_{D1}$ provides DC isolation between the RF signal processor 210 and the first input node N1, as well as between the RF signal processor 210 and the third input node N5. The capacitor $C_{D2}$ provides DC isolation between the RF signal processor 210 and the second input node N2, as well as between the RF signal processor 210 and the fourth input node N6. The receiver 200e can also adopt the blocking circuit 240b as depicted in FIG. 3B. The switches SW1-SW4 operate according to a differential local oscillator signal pair LOI+ and LOI−, while the switches SW5-SW8 operate according to a differential local oscillator signal pair LOQ+ and LOQ−. In other words, the switches SW1-SW8 selectively connect/disconnect the corresponding input nodes to the corresponding output nodes depending on the corresponding local oscillator signals. Therefore, the switches SW1-SW4 can mix the RF signal $I_{RF}$ with the differential local oscillator signal pair LOI+ and LOI−, while the switches SW5-SW8 can mix the RF signal $I_{RF}$ with the differential local oscillator signal pair LOQ+ and LOQ−.

In the receiver 200e, the passive mixer 206 operate according to quadrature LO signals wherein the differential local oscillator signal LOI− has a 180 degree phase shift with respect to the differential local oscillator signal LOI+, the differential local oscillator signal LOQ+ has a 90 degree phase shift with respect to the differential local oscillator signal LOI+, the differential local oscillator signal LOQ− has a 270 degree phase shift with respect to the differential local oscillator signal LOI+. The filter 216 can include two RC filters each having a capacitor C1 and two resistors R1 and R2 (as depicted in FIG. 7), or having other configurations (such as those depicted in FIGS. 4 and 5). The out-of-band rejection ratio can be determined by properly selecting the values for the capacitor(s) and the resistor(s) of the filter 216.

Figure 8A:
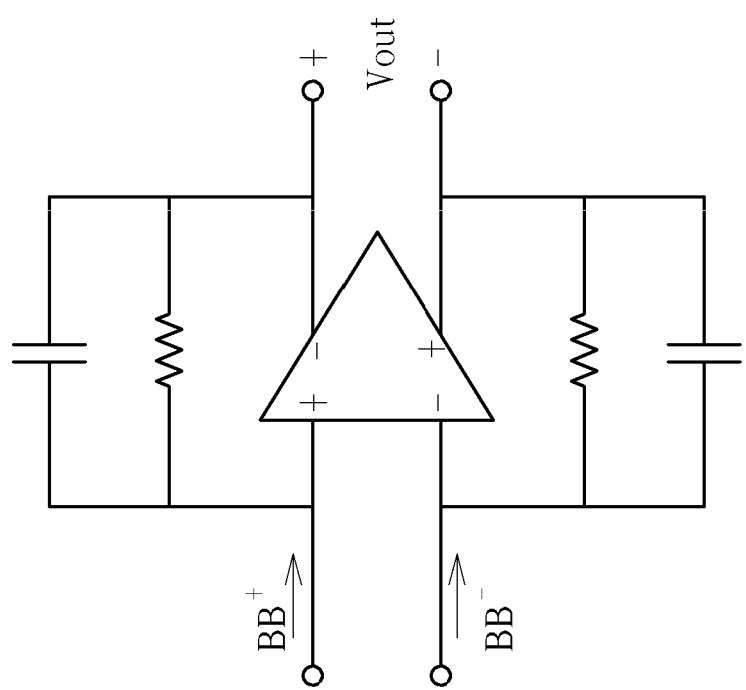
FIGS. 8A and 8B are circuit diagrams of the analog signal processor according to the embodiments of the present invention.
Figure 8B:
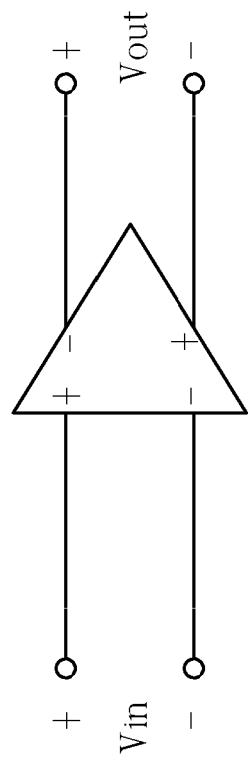

FIGS. 8A and 8B are circuit diagrams illustrating the analog signal processor 230 according to the embodiments of the present invention. For the current-in current-out RC filters depicted in FIGS. 3A, 3B and 4, the analog signal processor 230 can be implemented by a transimpedance amplifier comprising an operational amplifier with RC feedback (as depicted in FIG. 8A). For the current-in voltage-out RC filter depicted in FIG. 5, the analog signal processor 230 can be implemented by a voltage amplifier (as depicted in FIG. 8B).

The embodiments of the present invention can also use other configurations of RC filters for providing low-pass, band-pass or high-pass frequency responses, as well as other types of analog signal processors according to the requirement of the wireless communication system. The configurations shown in FIGS. 3-5 and 8A-8B are merely for illustrative purpose, and do not limit the scope of the present invention.

In the embodiments of the present invention, the interference-robust receiver for a wireless communication system can be implemented without a SAW filter or other similar components which are expensive to fabricate and consume large space. Using a passive mixer followed by a proper filter, the frequency conversion interface of the embodiments can suppress the RF voltage swing resulted from the out-of-band RF signal at its input and suppress the intermediate frequency out-of-band signal swing at its output. Therefore, both analog and RF signal processors, which are disposed after and before the frequency conversion interface, respectively, can be protected from being saturated by the received out-of-band RF signal. Since both analog and RF signal processors can function normally in the presence of strong out-of-band blocking signals, the weak RF signals can thus be successfully detected by the interference-robust receiver for subsequent applications.

Figure 9A:
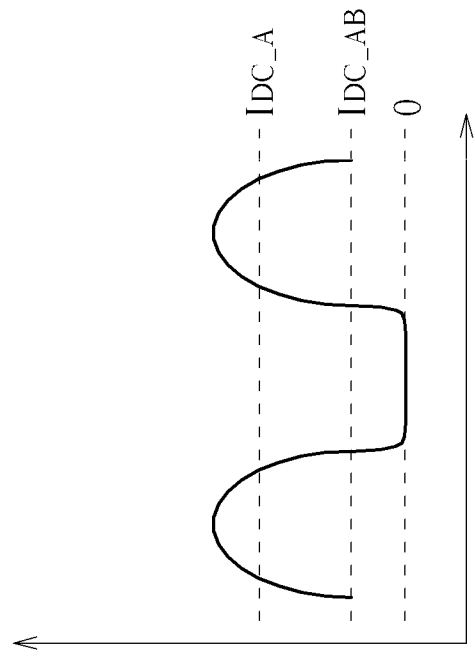
FIG. 9A is a diagram showing an operation of a MOS transistor biased to operate in a class-A mode.
Figure 9B:
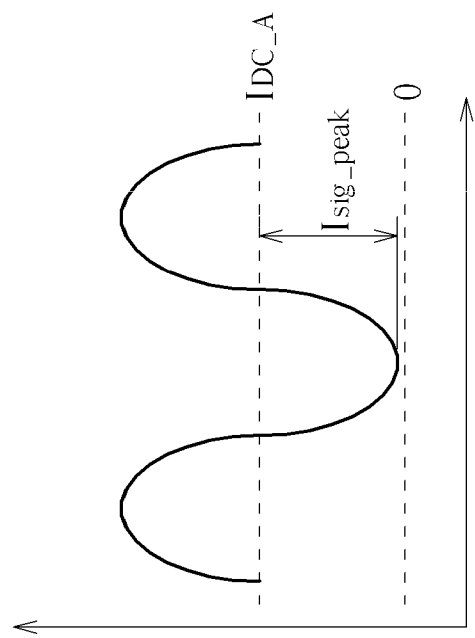
FIG. 9B is a diagram showing an operation of a MOS transistor biased to operate in a class-AB mode.

As shown in FIG. 2A and FIG. 2B, an amplifier for signal enhancement (e.g., LNA 214) is implemented in the RF signal processor 210. For example, the LNA 214 may be realized by a class-A amplifier. Therefore, the metal-oxide-semiconductor (MOS) transistor of the class-A amplifier is biased to operate in a class-A mode, and a bias current (i.e., an average current) $I_{DC\_A}$ of the MOS transistor should be properly set to a level greater than an in-band signal peak level $I_{sig\_peak}$, as shown in FIG. 9A. For instance, regarding a case where a specified transconductance of 120 mA/V and an out-of-band signal (i.e., an out-of-band jammer/blocker/interferer) at +1 dBm, the required bias current $I_{DC\_A}$ should be greater than 42 mA, resulting in significant power consumption. To lower the power consumption, one exemplary embodiment of the present invention employs a class-AB amplifier. As clearly shown in FIG. 9B, the bias current $I_{DC\_AB}$ under the class-AB mode is lower than the bias current $I_{DC\_A}$ under the class-A mode.

Figure 10:
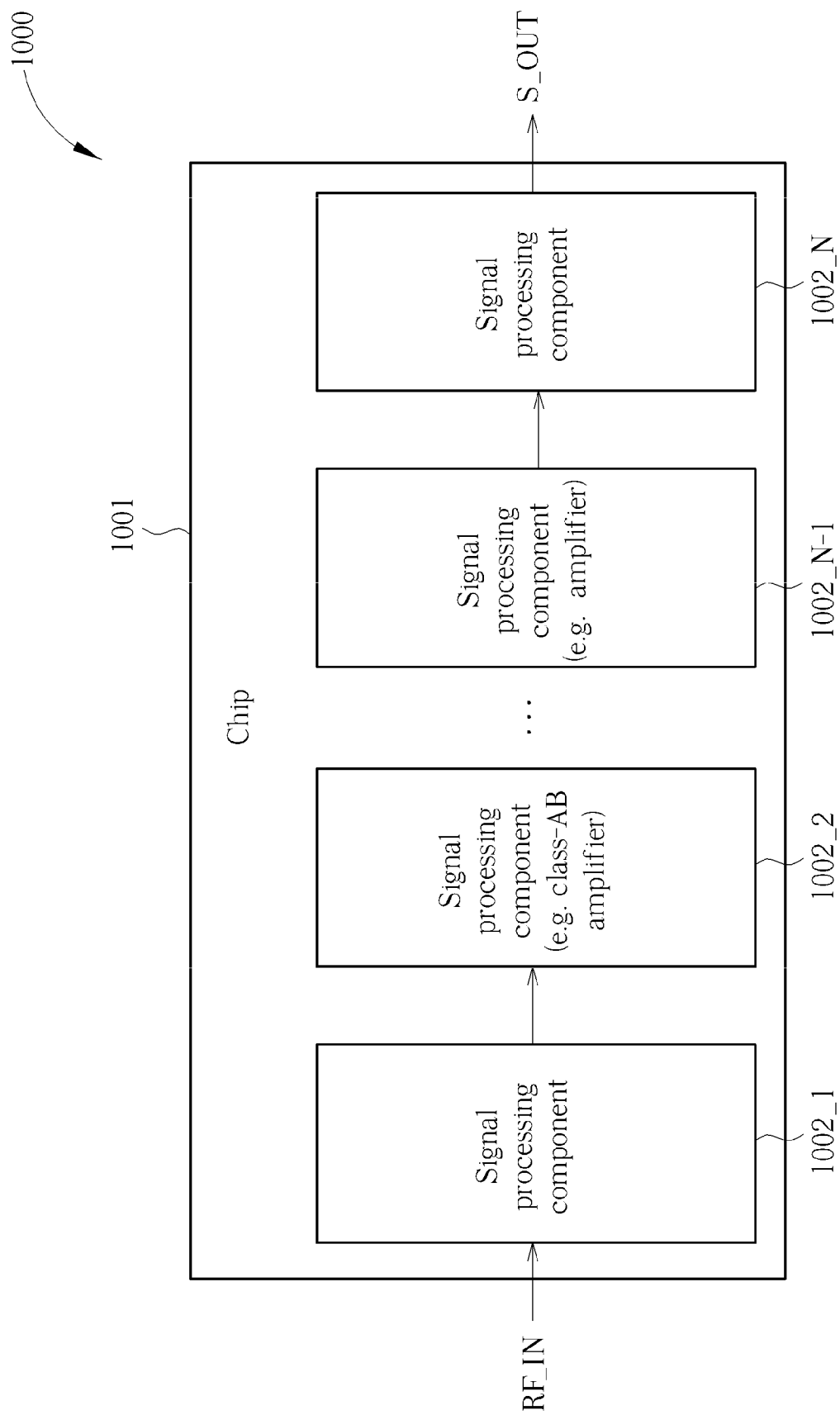
FIG. 10 is a block diagram showing one exemplary wireless communication receiver having a class-AB amplifier included therein.

In view of above, another conception of the present invention is to use a class-AB amplifier in a wireless communication receiver. FIG. 10 is a block diagram showing one exemplary wireless communication receiver having a class-AB amplifier included therein. The exemplary receiver 1000 for a wireless communication system includes a plurality of signal processing components 1002_1, . . . , 1002_N arranged to generate a receiver output S_OUT according to an RF signal RF_IN, where the signal processing components 1002_1, . . . , 1002_N comprise amplifiers having a class-AB biased amplifier included therein. By way of example, but not limitation, the signal processing components 1002_2 and 1002_N–1 are amplifiers, where the signal processing component 1002_2 is a class-AB biased amplifier. As shown in FIG. 10, the signal processing components 1002_1, . . . , 1002_N are disposed in a chip 1001, and the class-AB biased amplifier (e.g., the signal processing component 1002_2) is an amplifier which processes a signal corresponding to the RF signal RF_IN before any other amplifier (e.g., the signal processing component 1002_N–1) included in the same chip 1001. It should be noted that the receiver output S_OUT can be any result derived from processing the RF signal RF_IN, depending upon the actual design of the signal processing components 1002_1, . . . , 1002_N. For example, the receiver output S_OUT may be a baseband output, the signal processing component 1002_2 may be an LNA, and the signal processing component 1002_N–1 may be a programmable gain amplifier (PGA). As the implemented class-AB biased amplifier is the first amplifier which processes a signal derived from the received RF signal, the receiver performance improvement offered by the implemented class-AB biased amplifier is optimum.

Figure 11:
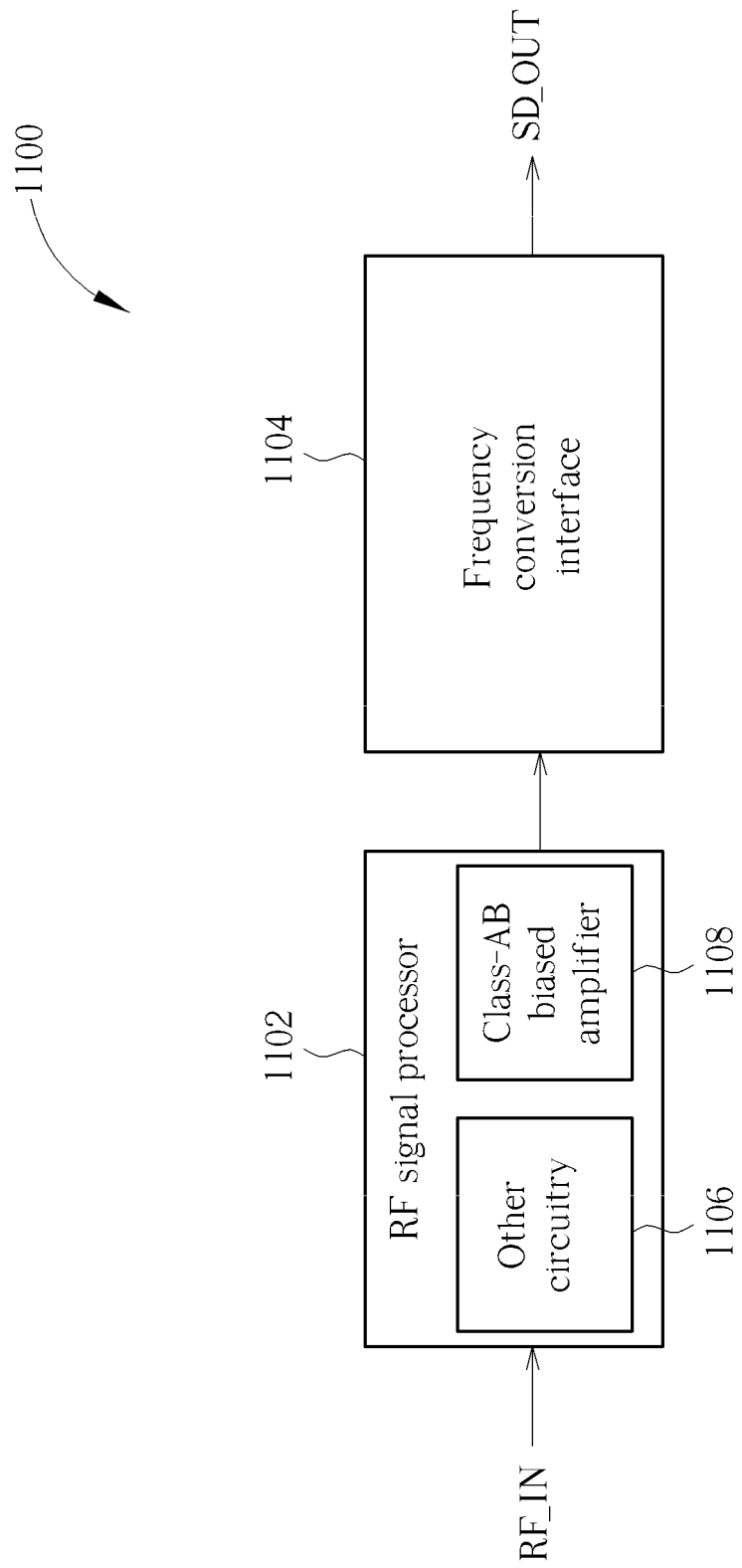
FIG. 11 is a block diagram showing another exemplary wireless communication receiver having a class-AB amplifier included therein.

FIG. 11 is a block diagram showing another exemplary wireless communication receiver having a class-AB amplifier included therein. The exemplary receiver 1100 for a wireless communication system includes an RF signal processor 1102 and a frequency conversion interface 1104, where the RF signal processor 1102 is configured to provide an RF signal RF_IN to the frequency conversion interface 1104, and the frequency conversion interface 1104, coupled to the RF signal processor 1102, is utilized for generating a down-converted result SD_OUT of the RF signal received form the RF signal processor 1102. As shown in FIG. 11, the RF signal processor 1102 includes a class-AB biased amplifier 1108 utilized for applying amplification upon the RF signal RF_IN; additionally, the RF signal processor 1102 may also include other circuitry 1106 for handling the incoming RF signal RF_IN. For example, other circuitry 1106 may have a matching network included therein. As the implemented class-AB biased amplifier 1108 applies signal processing upon the RF signal before the down-conversion is performed upon the RF signal by the frequency conversion interface 1104, the receiver performance improvement offered by the implemented class-AB biased amplifier is optimum.

Figure 12A:
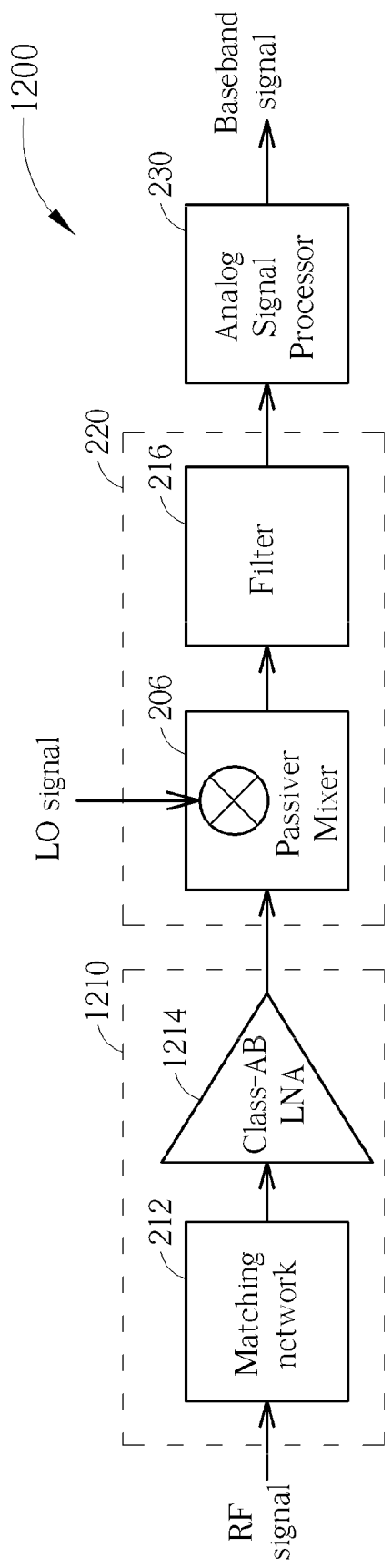
FIGS. 12A and 12B are functional diagrams illustrating another interference-robust receiver for a wireless communication system according to embodiments of the present invention.
Figure 12B:
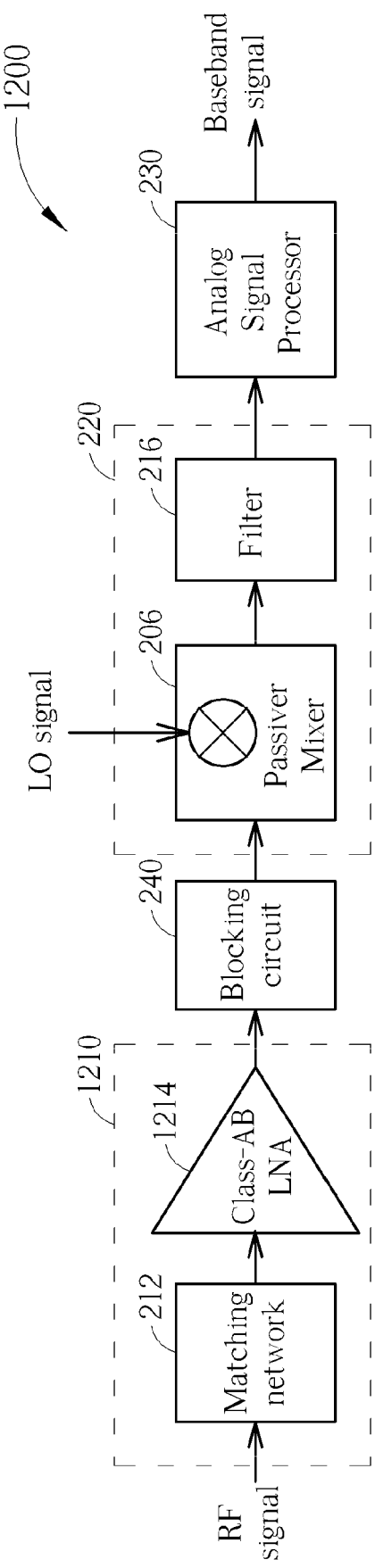

Each of the receiver architectures shown in FIG. 10 and FIG. 11 can be employed to realize an interference-robust receiver with improved dynamic range/power efficiency. FIGS. 12A and 12B are functional diagrams illustrating another interference-robust receiver 1200 for a wireless communication system according to embodiments of the present invention. The interference-robust receiver 1200 in FIGS. 12A and 12B is similar to the interference-robust receiver 200 in FIGS. 2A and 2B. The major difference is that the LNA 1214 included in the RF signal processor 1210 is a class-AB biased amplifier. It should be noted that the blocking circuit 240, the frequency conversion interface 220 and the analog signal processor 230 shown in FIGS. 12A and 12B can also be implemented according to the afore-mentioned exemplary circuits shown in FIGS. 3A, 3B, 4, 5, 7, 8A and 8B. As a person skilled in the art can readily understand operations and functions of all the components, except the class-AB LNA 1214, after reading above paragraphs, further description is omitted here for brevity.

In a case where the receiver architecture shown in FIG. 10 is employed, the RF signal processor 1210, the frequency conversion interface 220 and the analog signal processor 230 are disposed in the same chip or the RF signal processor 1210, the blocking circuit 240, the frequency conversion interface 220 and the analog signal processor 230 are disposed in the same chip, where the class-AB LNA 1214, which is a class-AB biased amplifier, is an amplifier that processes a signal corresponding to the RF signal before any other amplifier included in the chip (e.g., a PGA included in the analog signal processor 230). In another case where the receiver architecture shown in FIG. 11 is employed, it is self-explanatory that the class-AB LNA 1214, which is a class-AB biased amplifier, applies signal processing upon the RF signal before the down-conversion is performed upon the RF signal by the passive mixer 202 included in the frequency conversion interface 220. To put it simply, due to an innovative filter disposed after the passive mixer and an innovative class-AB LNA disposed before the passive mixer, an interference-robust receiver with improved dynamic range/power efficiency is realized. Details of the class-AB LNA 1214 is described hereinafter.

Figure 13:
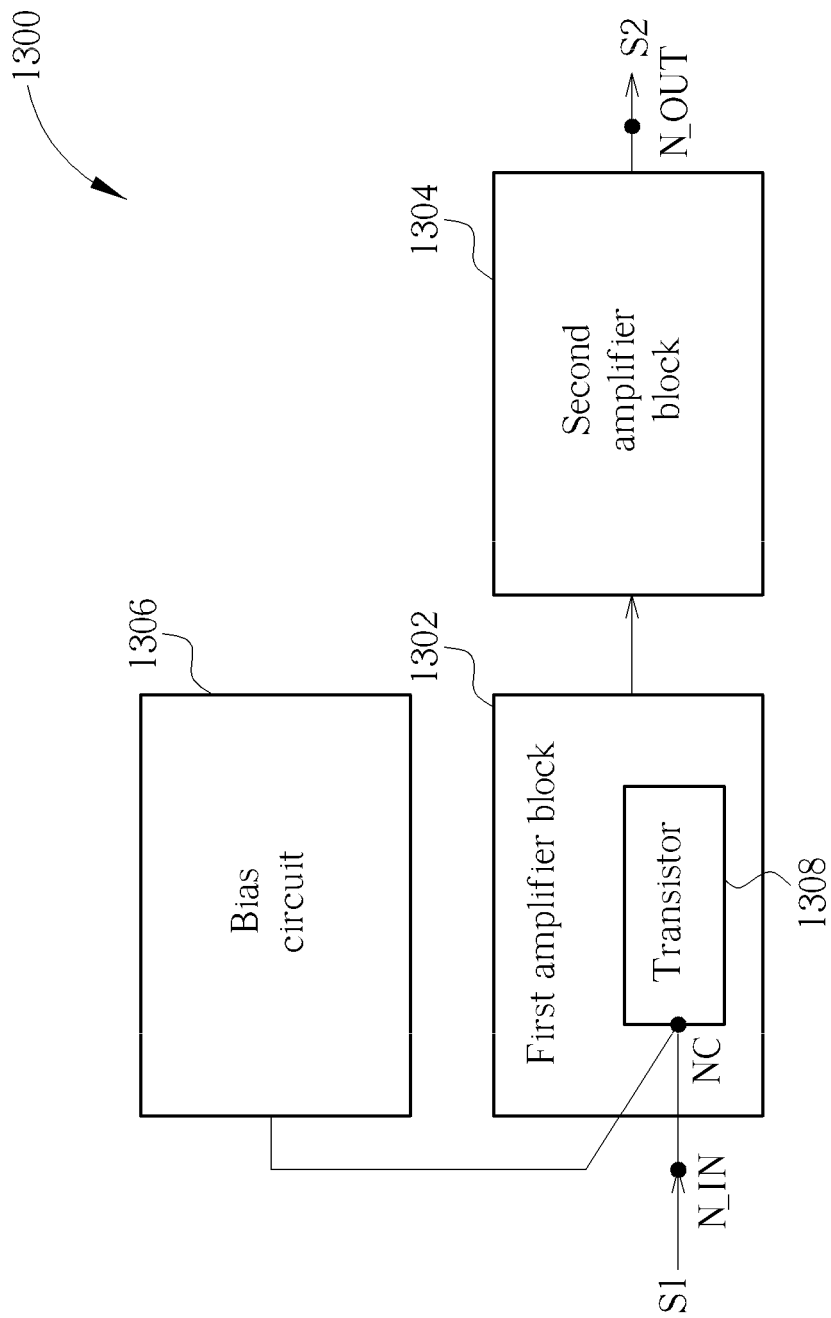
FIG. 13 is a block diagram of a class-AB biased amplifier according to an exemplary embodiment of the present invention.

FIG. 13 is a block diagram of a class-AB biased amplifier according to an exemplary embodiment of the present invention. The exemplary class-AB biased amplifier 1300 includes, but is not limited to, a first amplifier block 1302, a second amplifier block 1304, and a bias circuit 1306. The first amplifier block 1302 is coupled to an input port N_IN of the class-AB biased amplifier 1300, and receives an input S1 at the input port N_IN. The bias circuit 1306 is coupled to the first amplifier block 1302, and is implemented to bias the first amplifier block 1302 for a class-AB operation. For example, the first amplifier block 1302 includes at least a transistor 1308 serving as an input transistor. Therefore, the transistor 1308 has a control terminal NC coupled to the bias circuit 1306, and is biased by the bias circuit 1306 to operate in the class-AB mode. More specifically, when an out-of-band signal is present, the transistor 1308 is guaranteed to operate in the class-AB mode. It should be noted that the class-AB operation of the first amplifier block 1302 is achieved by simply setting the bias point of the transistor. Thus, the class-AB biased amplifier 1300 is different from a class-AB push-pull amplifier. The second amplifier block 1304 is coupled to the first amplifier block 1302 and an output port N_OUT of the class-AB biased amplifier 1300, and generates an output S2 at the output port N_OUT according to an output of the first amplifier block 1302.

It should be noted that only one transistor is shown in FIG. 13 for simplicity; however, the number of transistors implemented in the first amplifier block 1302 configured for receiving the input S1 is adjustable, depending upon actual design consideration and application requirement. For example, when the aforementioned class-AB LNA 1214 is implemented by the class-AB biased amplifier 1300, the class-AB LNA 1214 may be configured to be a pseudo-differential LNA, a single-ended LNA, or a fully differential LNA.

Moreover, to lower the power consumption without compromising gain compression performance, the implemented transistor 1308 has an exponential current versus voltage characteristic, leading to gain expansion used for achieving very high dynamic range. More specifically, as the current passing through the transistor 1308 has an exponential change when the control voltage applied to the control terminal NC changes linearly, a bias current (i.e., an average current) passing through the transistor 1308 will change automatically in response to an input power level change, without any detection and feedback circuitry applied thereto. Therefore, the current consumption of the class-AB LNA 1214 would vary adaptively with the RF input power, resulting in significant power savings under real world operating conditions where strong out-of-band signals are not always present.

In one exemplary implementation, the transistor 1308 is a bipolar junction transistor (BJT). In addition, as a MOS transistor operating in a weak inversion region would have an exponential current versus voltage characteristic, the transistor 1308 may also be a MOS transistor biased by the bias circuit 1306 to operate in the weak inversion region. For example, the exponential current versus voltage characteristic can be simply expressed as follows:

$$I_d \approx e^{\frac{V_{GS}}{V_T}},$$

where $I_d$ represents the current passing through the MOS transistor operate in the weak inversion region, $V_{GS}$ represents the gate-source voltage, and $V_T$ represents the threshold voltage.

Figure 14:
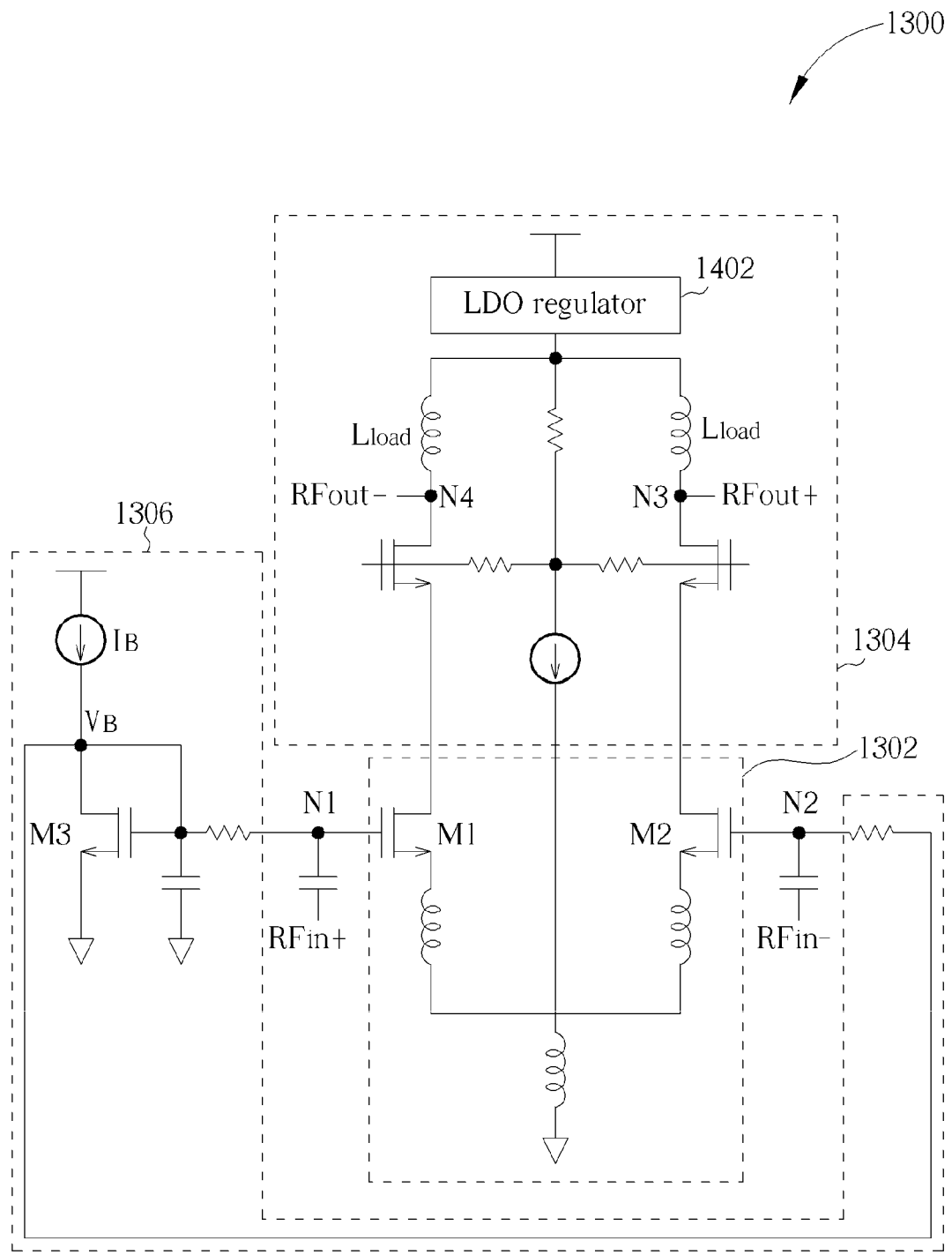
FIG. 14 is a diagram illustrating one exemplary circuit of the class-AB biased amplifier shown in FIG. 13.

FIG. 14 is a diagram illustrating one exemplary circuit of the class-AB biased amplifier 1300. The class-AB biased amplifier 1300 shown in FIG. 14 is a fully differential transconductance amplifier whose output is a current signal, and may be employed to realize the class-AB LNA 1214 shown in FIGS. 12A and 12B since the frequency conversion interface 220 is operated as a current driven interface to the RF signal processor 1210 for an output-of-band part of the RF signal. As shown in FIG. 14, the input port of the class-AB biased amplifier 1300 includes input nodes N1 and N2 for receiving a differential input signal pair $RF_{in}+$ and $RF_{in}-$, and the output port of the class-AB biased amplifier 1300 includes output nodes N3 and N4 for outputting a differential output signal pair $RF_{out}+$ and $RF_{out}-$. The bias circuit 1306 generates a bias voltage $V_B$ (e.g., 450 mV) for biasing the MOS transistors M1 and M2 to operate in the weak inversion region, where the bias voltage $V_B$ is determined by a bias current $I_B$ and a diode-connected MOS transistor M3. For example, the size of the diode-connected MOS transistor M3 can be properly chosen to make the bias voltage $V_B$ capable of biasing the MOS transistors M1 and M2 in the weak inversion region. However, this is for illustrative purposes only. Any means capable of generating a desired bias voltage applied to the MOS transistors M1 and M2 can be employed by the bias circuit 1306. Compared to the case where the MOS transistors M1 and M2 operate in class-A mode, the MOS transistors M1 and M2 operating in the weak inversion region for class-AB operation have lower bias currents (lower average currents), leading to improved power efficiency. For example, if no out-of-band signal is present, the bias current of each MOS transistor under class-A mode is 18 mA, but the bias current of each MOS transistor under class-AB mode can be lowered to 4 mA. Regarding the second amplifier block 1304, an inductive load $L_{load}$ is used to maximize the headroom available for active devices; in addition, a low dropout (LDO) regulator 1402 is used to provide a supply voltage, say, 2.7V. The 2.7V supply together with low impedance provided by the filter 216 which suppresses out-of-band signal can avoid output clipping and suppress output distortion. The circuitry shown in FIG. 14 is for illustrative purposes only. That is, any amplifier architecture obeying the spirit of the present can be adopted to realize the class-AB biased amplifier 1300 or class-AB LNA 1214. These alternative amplifier designs all fall within the scope of the present invention.

As mentioned above, the amplifier for signal enhancement (e.g., LNA 214) may be implemented using a class-AB biased amplifier for low power consumption. However, when the input power of the in-band part of the received RF signal is large (e.g., −15 dBm), the second harmonic of the class-AB biased amplifier may be too significant to be neglected. For example, the LO signal needed by the passive mixer 206 mentioned above may be derived from an oscillating signal generated by an oscillator such as a voltage-controlled oscillator (VCO). The second harmonic of the class-AB biased amplifier may leak to the VCO and result in an unwanted spur. As a result, the in-band part of the received RF signal will be down-converted by this unwanted spur to the wanted baseband and then corrupt the wanted in-band part of the baseband signal. As it is difficult to predict how the actual leakage of the second harmonic of the class-AB biased amplifier affects other circuit components, filtering out the actual leakage of the second harmonic of the class-AB biased amplifier is infeasible. Therefore, the possible solution of mitigating the interference caused by the leakage of the second harmonic of the class-AB biased amplifier is to reduce the second harmonic of the class-AB biased amplifier. Based on such observation, a plurality of exemplary amplifiers with harmonic reduction techniques employed therein are proposed. More specifically, when the input power of an input signal exceeds a predetermined level, meaning that the second harmonic is not negligible, the proposed amplifier will leave one gain mode and enter another gain mode for reducing the second harmonic generation. Details are described as follows.

Figure 15:
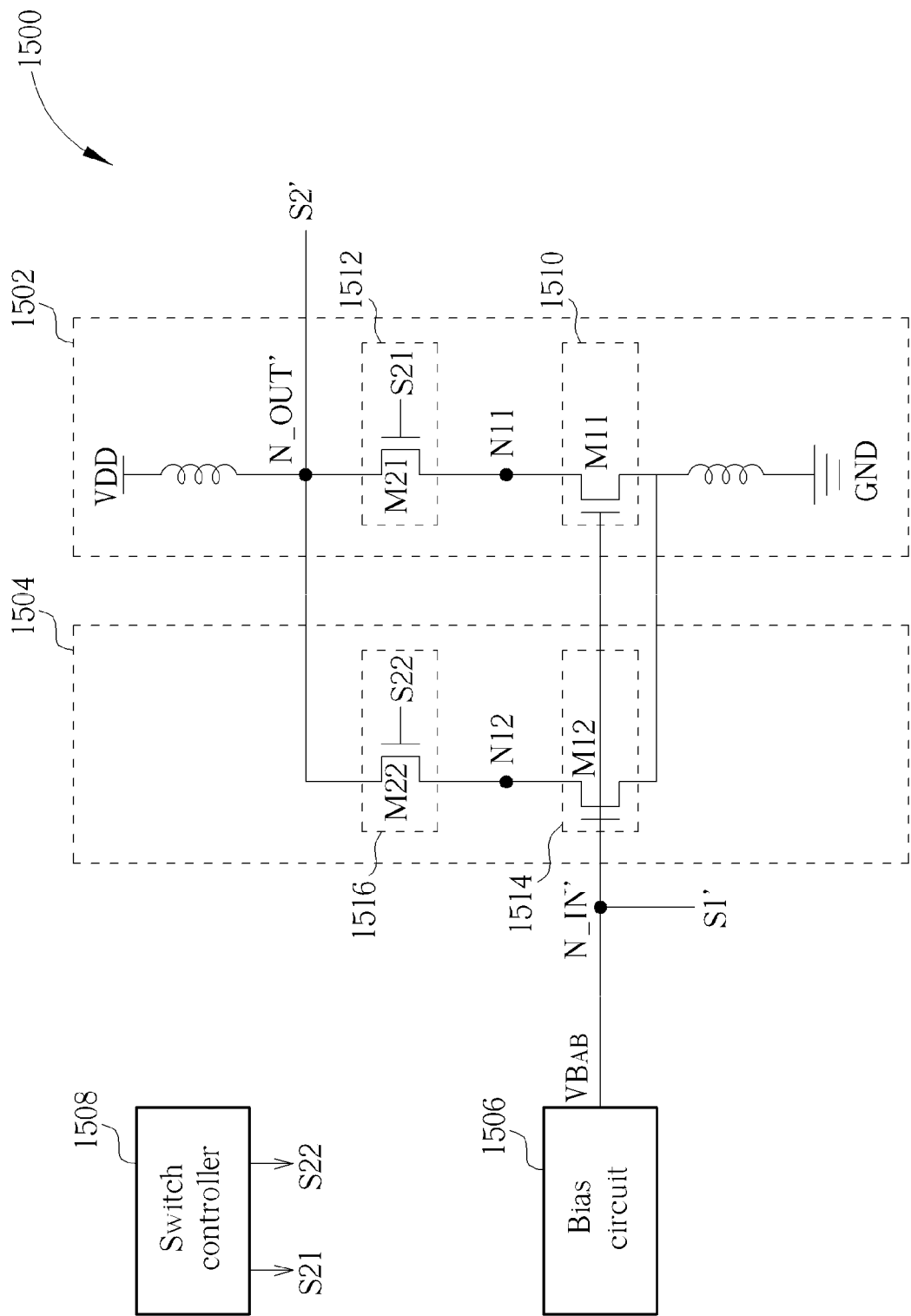
FIG. 15 is a diagram illustrating an amplifier supporting different gain modes according to an exemplary embodiment of the present invention.

FIG. 15 is a diagram illustrating an amplifier supporting different gain modes according to an exemplary embodiment of the present invention. The exemplary amplifier 1500 includes, but is not limited to, a first amplifier block 1502, a second amplifier block 1504, a bias circuit 1506, and a switch controller 1508. Each of the first amplifier block 1502 and the second amplifier block 1504 is coupled to an input port N_IN' and an output port N_OUT' of the amplifier 1500. The first amplifier block 1502 is arranged to amplify an input S1' (e.g., an RF signal), and includes an input stage 1510 arranged to receive the input S1' at the input port N_IN', and an optional switch unit 1512 coupled to the input stage 1510 and arranged to control a connection of an output node N11 of the input stage 1510. The second amplifier block 1504 includes an input stage 1514 arranged to receive the input S1' at the input port N_IN', and a switch unit 1516 coupled to the input stage 1514 and arranged to control a connection of an output node N12 of the input stage 1514. In this exemplary embodiment, the input stages 1510 and 1514 are transconductance stages respectively implemented by MOS transistors M11 and M12 which act as input transistors, the switch unit 1512 is implemented by a MOS transistor M21, and the switch unit 1516 is implemented by a MOS transistor M22. It should be noted that the sizing (transconductance) of the MOS transistor M12 is greater than that of the MOS transistor M11. The bias circuit 1506 is coupled to the first amplifier block 1502 and the second amplifier block 1504, and is implemented for biasing the first amplifier block 1502 and the second amplifier block 1504 for a class-AB operation. Specifically, the bias circuit 1506 is coupled to the MOS transistors M11 and M12, and generates a bias voltage $VB_{AB}$ to make the MOS transistors M11 and M12 biased to operate in the class-AB mode. Thus, the class-AB operation of the first amplifier block 1502 and the second amplifier block 1504 is simply achieved by setting the bias points of the MOS transistors M11 and M12. By way of example, but not limitation, the bias circuit 1506 may be realized using the circuit of the bias circuit 1306 shown in FIG. 14. The switch controller 1508 is arranged to control operation of the switch units 1512 and 1516. For example, the switch controller 1508 generates switch control signals S21 and S22 to control the on/off statuses of the MOS transistors M21 and M22, respectively.

When the input power of the input S1' is low, the amplifier 1500 enters a first gain mode to apply a first gain to the input S1' and accordingly generates an output S2' at the output port N_OUT'. When the amplifier 1500 operates under the first gain mode, the switch controller 1508 sets the switch control signals S21 and S22 to thereby turn on both of the MOS transistors M21 and M22. In this way, as the bias circuit 1506 applies a class-AB bias to each of the input stages 1502 and 1504 and the output nodes N11 and N12 are both coupled to the output port N_OUT' through the switch units 1512 and 1516 controlled by the switch controller 1508, the first gain which has a high gain value can be applied to the input S1' under the first gain mode of the amplifier 1500.

However, when the input power of the input signal A1' increases and exceeds a predetermined level, the amplifier 1500 enters a second gain mode to apply a second gain with a gain value lower than that of the aforementioned first gain. In addition, to reduce the amplifier gain as well as the unwanted second harmonic, the switch controller 1508 sets the switch control signals S21 and S22 to thereby turn on the MOS transistor M21 and turn off the MOS transistor M22. Though the bias circuit 1506 applies the bias voltage $VB_{AB}$ to the transistor M12, the transistor M12 is disconnected from the output port N_OUT' due to the MOS transistor M22 turned off by the switch controller 1508. In other words, the input stage 1514 in the second amplifier block 1504 is disabled by the switch unit 1516 controlled by the switch controller 1508. As the number of active input stages (e.g., active transconductance stages) under the second gain mode is smaller than that under the first gain mode, the unwanted second harmonic generation in the amplifier 1500 is mitigated. Please note that a voltage level of the bias voltage $VB_{AB}$ under the first gain mode and a voltage level of the bias voltage $VB_{AB}$ under the second gain mode may be the same or different.

Figure 16:
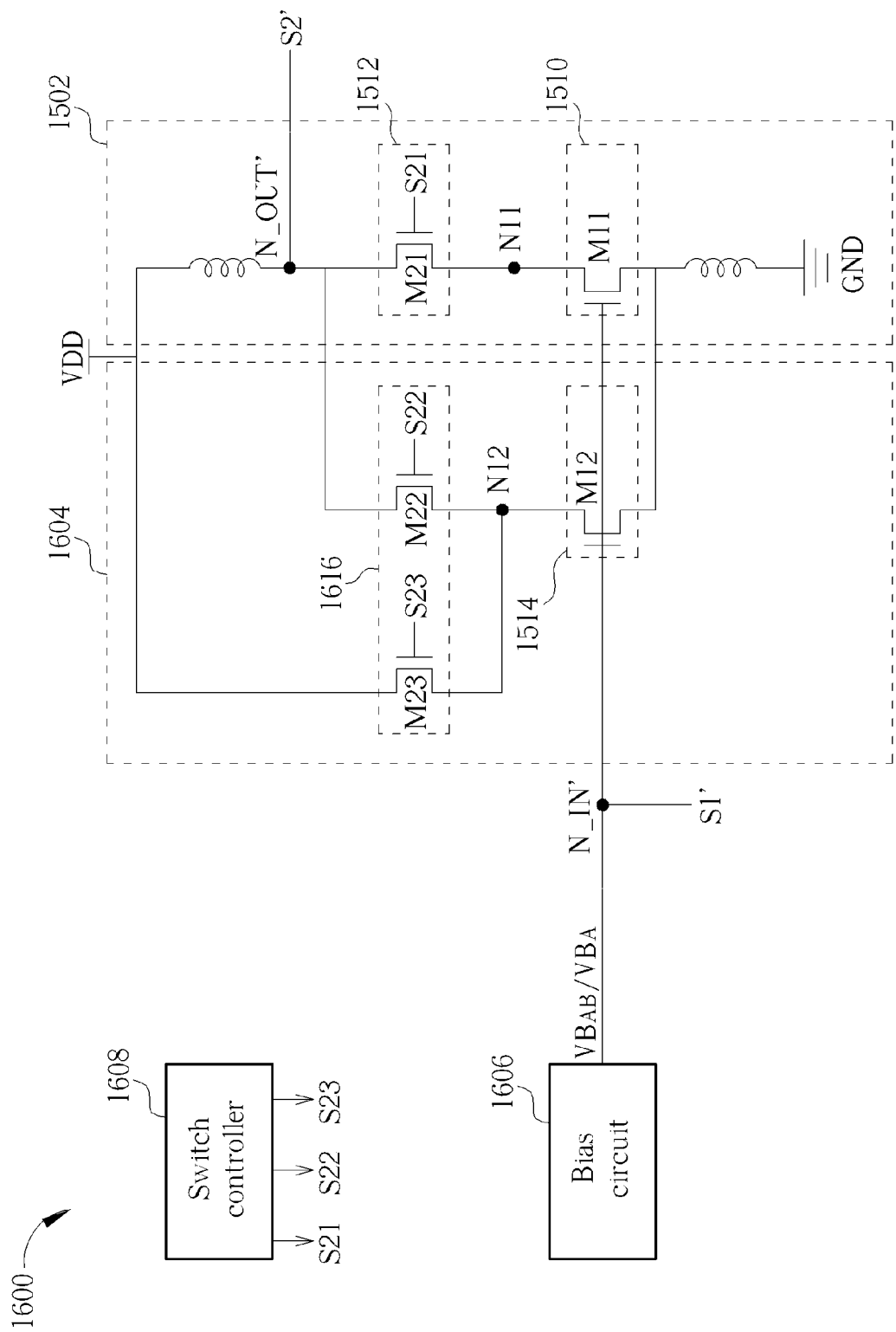
FIG. 16 is a diagram illustrating an amplifier supporting different gain modes according to another exemplary embodiment of the present invention.

FIG. 16 is a diagram illustrating an amplifier supporting different gain modes according to another exemplary embodiment of the present invention. The exemplary amplifier 1600 includes, but is not limited to, the first amplifier block 1502 shown in FIG. 15, a second amplifier block 1604, a bias circuit 1606, and a switch controller 1608. The difference between the second amplifier blocks 1504 and 1604 is that the second amplifier block 1604 has a switch unit 1616 implemented using two MOS transistors M22 and M23. As can be seen from FIG. 16, the switch unit 1616 selectively couples the output node N12 of the input state 1514 to a reference voltage (e.g., a supply voltage VDD) or the output port N_OUT' of the amplifier 1600. In addition, the bias circuit 1606 is coupled to the first amplifier block 1502 and the second amplifier block 1604, and is implemented for selectively biasing the first amplifier block 1502 and the second amplifier block 1604 for a class-AB operation or a class-A operation. Specifically, the bias circuit 1606 is coupled to the MOS transistors M11 and M12; in addition, the bias circuit 1606 generates the bias voltage $VB_{AB}$ to make the MOS transistors M11 and M12 biased to operate in the class-AB mode, and generates another bias voltage $VB_A$ ($VB_A > VB_{AB}$) to make the MOS transistors M11 and M12 biased to operate in the class-A mode. Moreover, the switch controller 1608 is arranged to control operation of the switch units 1512 and 1616. For example, the switch controller 1608 generates switch control signals S21, S22 and S23 to control the on/off statuses of the MOS transistors M21, M22, and M23, respectively.

When the input power of the input S1' is low, the amplifier 1600 enters a first gain mode to apply a first gain to the input S1' received at the input port (e.g., an RF signal) N_IN' and accordingly generates the output S2' at the output port N_OUT'. When the amplifier 1600 operates under the first gain mode, the switch controller 1608 sets the switch control signals S21, S22, and S23 to thereby turn on the MOS transistors M21 and M22 and turn off the MOS transistor M23. In this way, as the bias circuit 1604 applies a class-AB bias to each of the input stages 1502 and 1604 and the output nodes N11 and N12 are both coupled to the output port N_OUT' through the switch units 1512 and 1616 controlled by the switch controller 1608, the first gain which has a high gain value can be applied to the input S1' under the first gain mode of the amplifier 1600.

However, when the input power of the input S1' increases and exceeds a predetermined level, the amplifier 1600 enters a second gain mode to apply a second gain with a gain value lower than that of the aforementioned first gain. In addition, to reduce the amplifier gain as well as the second harmonic generation in the amplifier 1600, the switch controller 1608 sets the switch control signals S21, S22, and S23 to thereby turn on the MOS transistors M21 and M23 and turn off the MOS transistor M22, and the bias circuit 1606 applies a class-A bias, instead of a class-AB bias, to each of the input stages 1510 and 1514. Though the bias circuit 1606 applies the bias voltage $VB_A$ to the transistor M12, the current flowing through the transistor M12 is bypassed due to the output node N12 coupled to the reference voltage (e.g., the supply voltage VDD) through the electrically conductive MOS transistor M23. Compared to a class-AB biased amplifier, a class-A biased amplifier has less undesired harmonic generated therefrom. Thus, the second harmonic of the amplifier 1600 can be mitigated by making the MOS transistors M11 and M12 biased to operate in the class-A mode.

As shown in FIG. 2A and FIG. 2B, the matching network 212 is disposed before the LNA 214. In a case where the LNA 214 is implemented using the amplifier 1500 shown in FIG. 15, an input impedance change resulted from the disabled input stage 1514 may make the gain value of the second gain significantly affected by the matching gain contributed by the matching network 212. This is not desirable for the receiver design. Considering another case where the LNA 214 is implemented using the amplifier 1600 shown in FIG. 16, replacing the class-AB bias with the class-A bias boosts the DC current due to the fact that the class-A bias voltage $VB_A$ is higher than the class-AB bias voltage $VB_{AB}$. As a result, the tradeoff to suppress the unwanted second harmonic is to burn more DC current in the low gain (i.e. class-A) mode. However, when the input power is moderate (e.g. −40 to −22 dBm), a low-gain LNA is required but the unwanted second harmonic is still small enough to be neglected. In this situation, the amplifier should be switched to a low-gain mode but still biased under a class-AB mode to save power. Therefore, the present invention further proposes an improved amplifier design. Technical features of the improved amplifier design are detailed as follows.

Figure 17:
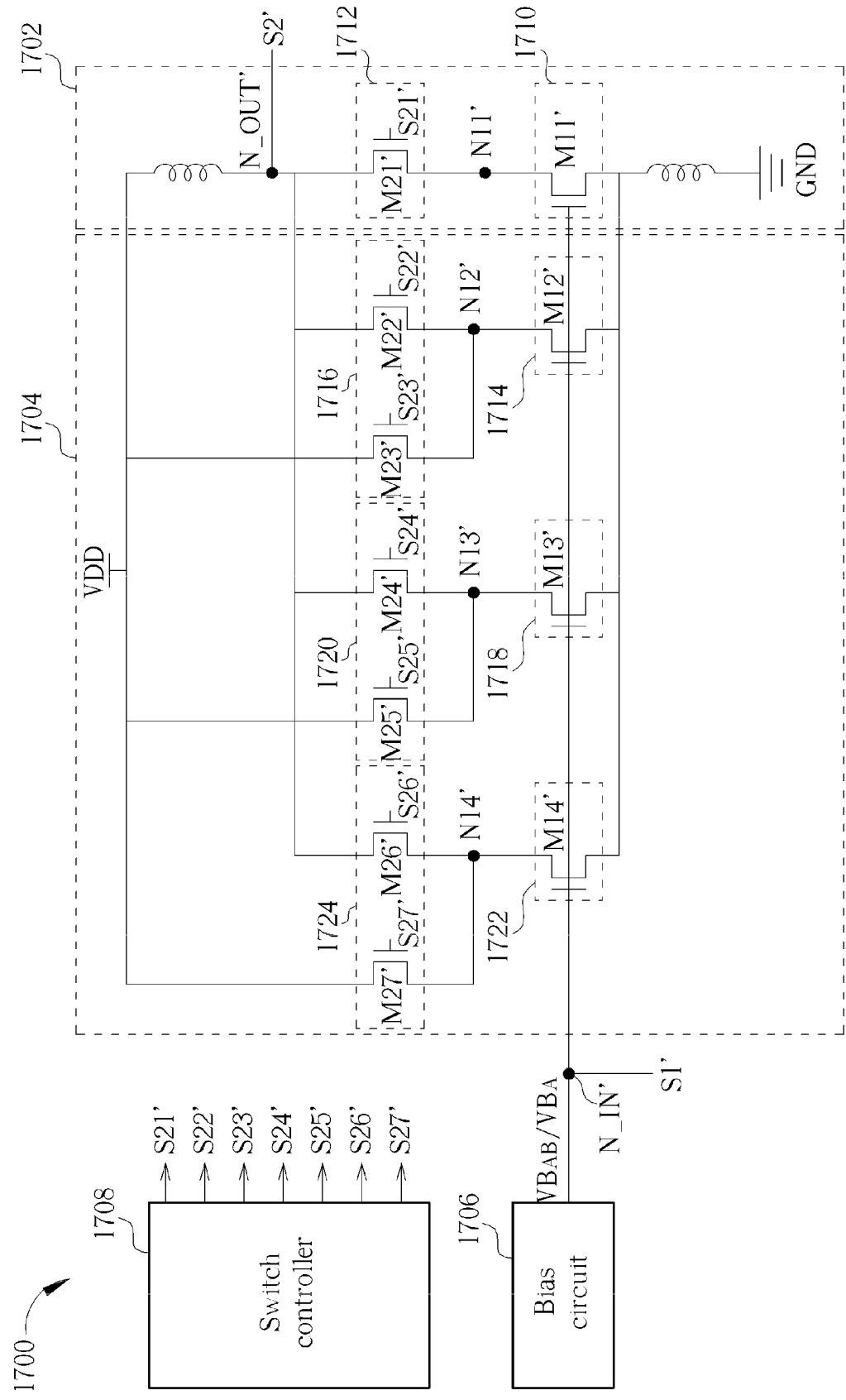
FIG. 17 is a diagram illustrating an amplifier supporting different gain modes according to yet another exemplary embodiment of the present invention.

FIG. 17 is a diagram illustrating an amplifier supporting different gain modes according to yet another exemplary embodiment of the present invention. The exemplary amplifier 1700 includes, but is not limited to, a first amplifier block 1702, a second amplifier block 1704, a bias circuit 1706, and a switch controller 1708. Each of the first amplifier block 1702 and the second amplifier block 1704 is coupled to an input port N_IN' and an output port N_OUT' of the amplifier 1700. The first amplifier block 1702 is arranged to amplify an input S1' (e.g., an RF signal), and includes an input stage 1710 arranged to receive the input S1' at the input port N_IN', and an optional switch unit 1712 coupled to the input stage 1710 for controlling a connection of an output node N11' of the input stage 1710. The second amplifier block 1704 includes a plurality of input stages 1714, 1718, and 1722 and a plurality of switch units 1716, 1720, and 1724. Each of the input stages 1710, 1714, 1718, and 1722 is arranged to receive the input S1' at the input port N_IN', and each of the switch units 1712, 1716, 1720, and 1724 is arranged to control a connection of an output node N11'/N12'/N13'/N14' of a corresponding input stage 1710/1714/1718/1722. More specifically, as can be seen from FIG. 17, the switch unit 1716 selectively couples the output node N12' of the input state 1714 to a reference voltage (e.g., a supply voltage VDD) or the output port N_OUT' of the amplifier 1700, the switch unit 1720 selectively couples the output node N13' of the input state 1718 to the reference voltage or the output port N_OUT', and the switch unit 1724 selectively couples the output node N14' of the input state 1722 to the reference voltage or the output port N_OUT'.

In this exemplary embodiment, the input stages 1710, 1714, 1718, and 1722 are transconductance stages respectively implemented by MOS transistors M11', M12', M13', and M14' which act as input transistors, the switch unit 1712 is implemented by a MOS transistor M21', the switch unit 1716 is implemented by MOS transistors M22' and M23', the switch unit 1720 is implemented by MOS transistors M24' and M25', and the switch unit 1724 is implemented by MOS transistors M26' and M27'. In addition, the sizing (transconductance) of each of the MOS transistors M13' and M14' is greater than that of each of the MOS transistors M11' and M12'. By way of example, but not limitation, the sizing (transconductance) of the MOS transistors M11', M12', M13', and M14' has the ratio relation of 0.5:0.5:10:10.

The bias circuit 1706 is coupled to the first amplifier block 1702 and the second amplifier block 1704, and is implemented for biasing the first amplifier block 1702 and the second amplifier block 1704 for a class-AB operation or a class-A operation. For example, the bias circuit 1706 is coupled to the MOS transistors M11', M12', M13', and M14'; in addition, the bias circuit 1706 generates a bias voltage $VB_{AB}$ to make the MOS transistors M11', M12', M13', and M14' biased to operate in the class-AB mode, and generates a bias voltage $VB_A$ to make one or more of the MOS transistors M11', M12', M13', and M14' biased to operate in the class-A mode. The switch controller 1708 is arranged to control operation of the switch units 1712, 1716, 1720, and 1724. For example, the switch controller 1708 generates switch control signals S21'-S27' to control the on/off statuses of the MOS transistors M21'-M27', respectively.

The exemplary amplifier 1700 is configured to support different gain modes, including a high gain (HG) mode (e.g., an HG class-AB mode) and two low gain (LG) modes (e.g., an LG class-AB mode and an LG class-A mode). When the input power of the input S1' is low, the amplifier 1700 enters the HG class-AB mode to apply a first gain to the input S1' at the input port N_IN' and accordingly generates the output S2' at the output port N_OUT'. When the amplifier 1700 operates under the HG class-AB mode, the bias circuit 1706 generates the bias voltage $VB_{AB}$ to each of the input stages 1710, 1714, 1718, and 1722, and the switch controller 1708 sets the switch control signals S21'-S27' to thereby turn on the MOS transistors M21', M22', M24', and M26' and turn off the MOS transistors M23', M25', and M27'. In this way, as the bias circuit 1706 applies a class-AB bias to each of the input stages 1710, 1714, 1718, and 1722 and the output nodes N11'-N14' are all coupled to the output port N_OUT' through the switch units 1712, 1716, 1720, and 1724 controlled by the switch controller 1708, the first gain which has a high gain value can be applied to the input S1' under the HG class-AB mode of the amplifier 1700.

When the input power of the input S1' increases and does not exceed a predetermined level yet, the amplifier 1700 enters the LG class-AB mode to apply a second gain with a gain value lower than that of the aforementioned first gain. When the amplifier 1700 operates under the LG class-AB mode, the bias circuit 1706 generates the bias voltage $VB_{AB}$ to each of the input stages 1710, 1714, 1718, and 1722, and the switch controller 1708 sets the switch control signals S21'-S27' to thereby turn on the MOS transistors M21', M22', M25', and M27' and turn off the MOS transistors M23', M24', and M26'. Though the bias circuit 1706 applies a class-AB bias to the input stages 1718 and 1722, the current flowing through the MOS transistors M13' and M14' is bypassed due to the output node N13' and N14' coupled to the reference voltage (e.g., the supply voltage VDD) through the electrically conductive MOS transistors M25' and M27'. In this way, the second gain which has a low gain value can be applied to the input S1' under the LG class-AB mode of the amplifier 1700. Please note that a voltage level of the bias voltage $VB_{AB}$ under the HG class-AB mode and a voltage level of the bias voltage $VB_{AB}$ under the LG class-AB mode may be the same or different.

When the input power of the input S1' further increases and exceeds the predetermined level, the amplifier 1700 enters the LG class-A mode to apply a third gain with a gain value substantially equal to or smaller than that of the aforementioned second gain. When the amplifier 1700 operates under the LG class-A mode, the bias circuit 1706 generates the bias voltage $VB_A$ to each of the input stages 1710, 1714, 1718, and 1722. That is, the bias circuit 1706 applies a class-A bias to the first amplifier block 1702 and the second amplifier block 1704. As mentioned above, the switch units 1712 and 1716 are controlled to couple the output nodes N11' and N12' to the output port N_OUT' when the amplifier 1700 operates under the LG class-AB mode; additionally, replacing the class-AB bias voltage $VB_{AB}$ with the class-A bias voltage $VB_A$ increases the amplifier gain accordingly. To make the third gain having a gain value substantially equal to or smaller than the gain value of the aforementioned second gain, the switch controller 1708 therefore sets the switch control signals S21'-S23' to turn on the MOS transistors M21' and M23' and turn off the MOS transistor M22'. Though the MOS transistors M11' and M12' are biased to operate in the class-A mode, the MOS transistor M12' is disconnected from the output port N_OUT' of the amplifier 1700. In this way, the gain value of the third gain under the LG class-A mode may be substantially equal to the that of the second gain under the LG class-AB mode because of an amplifier gain increase resulted from applying the class-A bias to the MOS transistor M11' and an amplifier gain decrease resulted from disconnecting the MOS transistor M12' from the output port N_OUT' of the amplifier 1700. Moreover, as the bias circuit 1706 outputs the class-A bias voltage $VB_A$ instead of the class-AB bias voltage $VB_{AB}$, the unwanted second harmonic can be effectively mitigated.

Additionally, when the amplifier 1700 operates under the LG class-A mode, the switch controller 1708 is arranged to further set the switch control signals S24'-S27' to thereby turn on the MOS transistor M25' and turn off the MOS transistors M24', M26', and M27'. Therefore, the MOS transistor M14' is disconnected from the output port N_OUT' due to the MOS transistors M26' and M27 turned off by the switch controller 1708. To put it simply, the switch controller 1708 controls the switch units 1716, 1720, and 1724 to disconnect the output nodes N12'-N14' from the output port N_OUT' of the amplifier 1700, where at least one input stage (e.g., the input stage 1722) is disabled by at least one switch unit (e.g., the switch unit 1724) controlled by the switch controller 1708. As the number of active input stages (e.g., active transconductance stages) under the LG class-A mode is smaller than that under the LG class-AB mode/HG class-AB mode, the unwanted second harmonic of the amplifier 1700 can be effectively mitigated. As mentioned above, turning off the MOS transistor in the input stage will change the input impedance of the amplifier. Therefore, in this exemplary embodiment, not all of the input stages in the second amplifier block 1704 are disabled under the LG class-A mode. For example, at least the input stage 1718 remains active to prevent the matching gain from being too high.

Please note that when the sizing (transconductance) of the MOS transistor M12' is small compared to that of the MOS transistors M13', the MOS transistor M12' may be turned off under the LG class-A mode since the matching gain variation caused by the disabled input stage 1714 is negligible.

Figure 18:
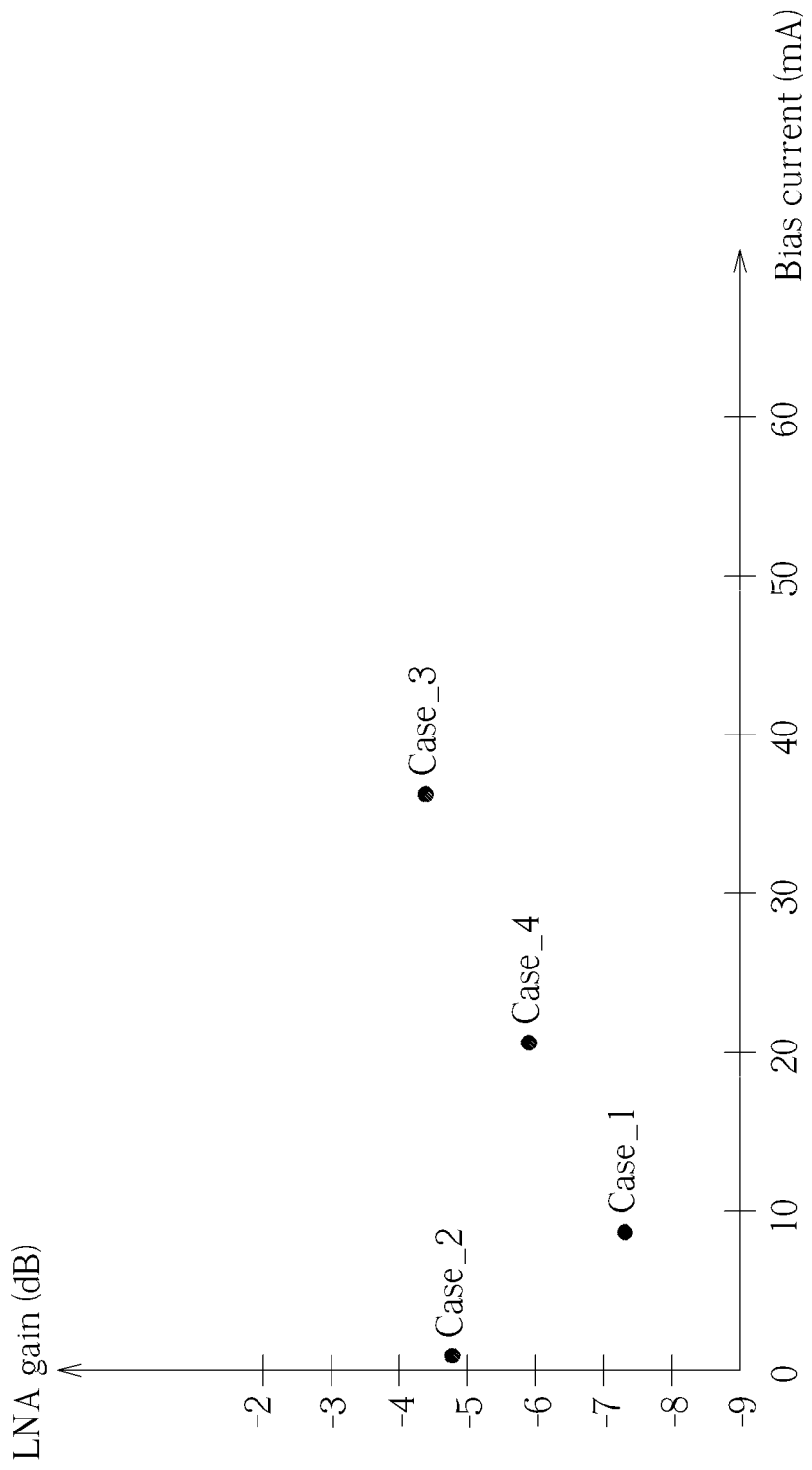
FIG. 18 is a diagram illustrating the relation between the LNA gain and the bias current under the low gain mode.
Figure 19:
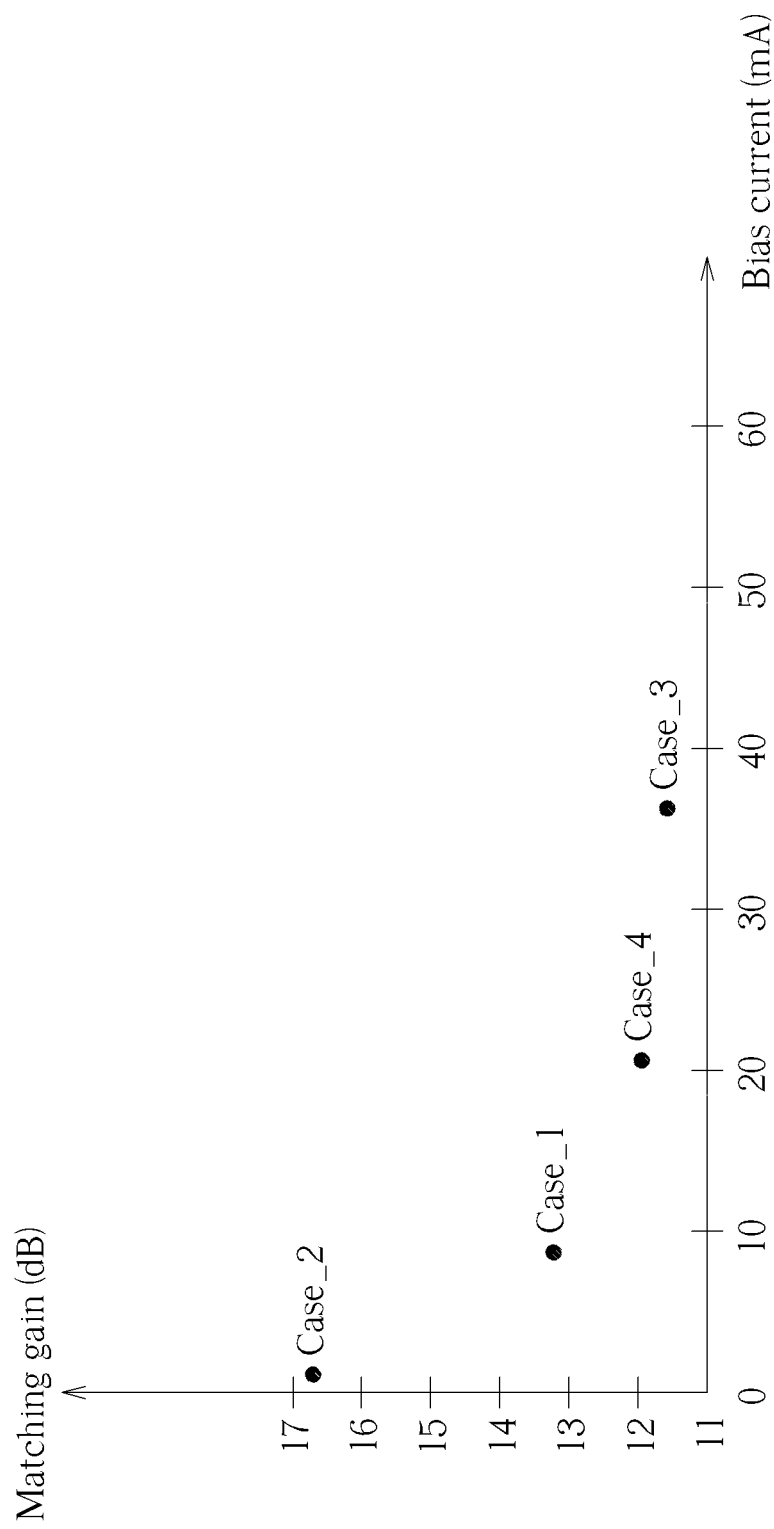
FIG. 19 is a diagram illustrating the relation between the matching gain and the bias current under the low gain mode.
Figure 20:
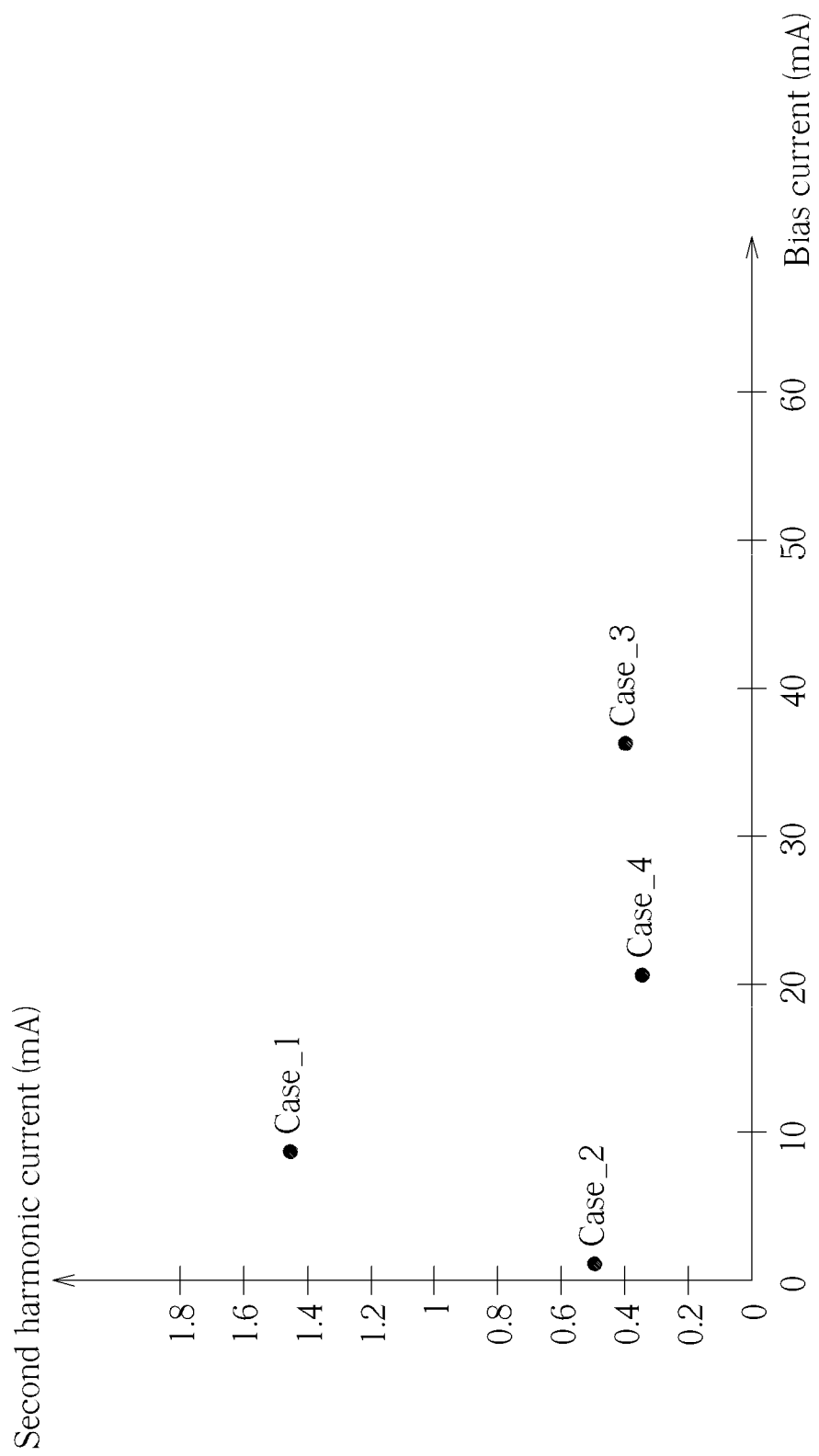
FIG. 20 is a diagram illustrating the relation between the matching gain and the bias current under the low gain mode.

Please refer to FIG. 18 in conjunction with FIG. 19 and FIG. 20. FIG. 18 is a diagram illustrating the relation between the LNA gain and the bias current under the low gain mode. FIG. 19 is a diagram illustrating the relation between the matching gain and the bias current under the low gain mode. FIG. 20 is a diagram illustrating the relation between the matching gain and the bias current under the low gain mode. Case_1 represents a situation where a receiver's LNA is realized by an amplifier without any harmonic reduction technique applied under the low gain mode, Case_2 represents a situation where a receiver's LNA is realized by an amplifier (e.g., the exemplary amplifier 1500) which uses the class-AB bias, enables the input stage in the first amplifier block, and disables each input stage in the second amplifier block under the low gain mode, Case_3 represents a situation where a receiver's LNA is realized by an amplifier (e.g., the exemplary amplifier 1600) which uses the class-A bias and enables all of the input stages in the first amplifier block and the second amplifier block under the low gain mode, and Case_4 represents a situation where a receiver's LNA is realized by an amplifier (e.g., the exemplary amplifier 1700) which uses the class-A bias, enables the input stage in the first amplifier block, and disables part of the input stages in the second amplifier block under the low gain mode. Compared with the amplifiers 1500 and 1600, the amplifier 1700 shown in FIG. 17 can achieve the objective of reducing the unwanted second harmonic generation in the amplifier without significantly increasing power consumption and changing the matching gain.

As mentioned above, the amplifier 1700 shown in FIG. 17 supports three gain modes (i.e., HG class-AB mode, LG class-AB mode, and LG class-A mode) and employs many harmonic reduction techniques (e.g., applying a class-A bias, disabling the input stage 1722, and disconnecting the input stage 1714 from the output port N_OUT'). However, this is for illustrative purposes only, and is not meant to be a limitation of the present invention. Any amplifier design with one or more technical features of the present invention employed therein falls within the scope of the present invention. For clarity, certain alternative designs of the amplifier 1700 in FIG. 17 are disclosed hereinafter.

Regarding a first alternative design, the amplifier 1700 shown in FIG. 17 is modified to omit the input stage 1722 and the corresponding switch unit 1724; however, the modified amplifier 1700 still supports the HG class-AB mode, LG class-AB mode, and LG class-A mode mentioned above. When the modified amplifier 1700 enters the HG class-AB mode, the MOS transistors M11'-M13' are biased under the class-AB mode, the MOS transistors M21', M22' and M24' are turned on, and the MOS transistors M23' and M25' are turned off. When the modified amplifier 1700 enters the LG class-AB mode, the MOS transistors M11'-M13' are still biased under the class-AB mode, the MOS transistors M21', M22' and M25' are turned on, and the MOS transistors M23' and M24' are turned off. When the modified amplifier 1700 enters the LG class-A mode, the MOS transistors M11'-M13' are biased under the class-A mode instead of the class-AB mode, the MOS transistors M21', M23' and M25' are turned on, and the MOS transistors M22' and M24' are turned off.

Regarding a second alternative design, the amplifier 1700 shown in FIG. 17 is modified to omit the input stage 1714 and the corresponding switch unit 1716, and only supports the HG class-AB mode and LG class-A mode mentioned above. When the modified amplifier 1700 enters the HG class-AB mode, the MOS transistors M11', M13', and M14' are biased under the class-AB mode, the MOS transistors M21', M24', and M26' are turned on, and the MOS transistors M25' and M27' are turned off. When the modified amplifier 1700 enters the LG class-A mode, the MOS transistors M11' and M13' are biased under the class-A mode instead of the class-B mode, the MOS transistors M21' and M25' are turned on, and the MOS transistors M24', M26' and M27' are turned off.

Regarding a third alternative design, the amplifier 1700 shown in FIG. 17 is modified to omit the input stages 1714 and 1722 and the corresponding switch units 1716 and 1724, and only supports the HG class-AB mode and LG class-A mode mentioned above. When the modified amplifier 1700 enters the HG class-AB mode, the MOS transistors M11' and M13' are biased under the class-AB mode, the MOS transistors M21' and M24' are turned on, and the MOS transistor M25' is turned off. When the modified amplifier 1700 enters the LG class-A mode, the MOS transistors M11' and M13' are biased under the class-A mode instead of the class-AB mode, the MOS transistors M21' and M25' are turned on, and the MOS transistor M24' is turned off.

Based on the technical features mentioned above, a person skilled in the art should readily appreciate that each of the amplifiers 1500, 1600, and 1700 and related alternative designs of the amplifier 1700 can be properly designed to have a single-ended amplifier configuration or a differential amplifier configuration, depending upon actual design consideration. Therefore, when a receiver's LNA (e.g., the LNA 214) is implemented by one of the amplifiers 1500, 1600, and 1700 and related alternative designs of the amplifier 1700, the LNA may be configured to be a pseudo-differential LNA, a single-ended LNA, or a fully differential LNA.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver for a wireless communication system, comprising:
   a plurality of signal processing components, arranged to generate a receiver output according to a radio frequency (RF) signal, the signal processing components comprising amplifiers having a class-AB biased amplifier included therein;
   wherein the signal processing components are disposed in a chip, and the class-AB biased amplifier is an amplifier which processes a signal corresponding to the RF signal before any other amplifier included in the chip, wherein the class-AB biased amplifier has an input port and an output port, and comprises:
   a first amplifier block, coupled to the input port, for receiving an input at the input port and generating a first output;
   a bias circuit, coupled to the first amplifier block and arranged to bias the first amplifier block for a class-AB operation; and
   a second amplifier block, coupled to the first amplifier block and the output port, for generating an output at the output port according to the first output.

2. The receiver of claim 1, wherein the first amplifier block comprises at least a transistor having a control terminal coupled to the bias circuit and thus biased by the bias circuit; and the transistor has an exponential current versus voltage characteristic.

3. The receiver of claim 2, wherein the transistor is a metal-oxide-semiconductor (MOS) transistor biased by the bias circuit to operate in a weak inversion region.

4. The receiver of claim 2, wherein the transistor is a bipolar junction transistor (BJT).

5. The receiver of claim 1, wherein the first amplifier block comprises at least a transistor having a control terminal coupled to the bias circuit and thus biased by the bias circuit; and a bias current passing through the transistor changes automatically in response to an input power level change, without any detection and feedback circuitry applied thereto.

6. The receiver of claim 5, wherein the transistor is a metal-oxide-semiconductor (MOS) transistor biased by the bias circuit to operate in a weak inversion region.

7. The receiver of claim 5, wherein the transistor is a bipolar junction transistor (BJT).

8. The receiver of claim 1, wherein the signal processing components belong to an RF signal processor and a frequency conversion interface, the RF signal processor is configured to generate the RF signal and includes the class-AB biased amplifier arranged to apply amplification upon the RF signal, and the frequency conversion interface is coupled to the RF signal processor and arranged to receive the RF signal generated from the RF signal processor and generate a down-converted result of the RF signal.

9. The receiver of claim 8, wherein the class-AB biased amplifier is a transconductance amplifier, and the frequency conversion interface is operated as a current driven interface to the RF signal processor for an output-of-band part of the RF signal.

10. The receiver of claim 9, wherein the frequency conversion interface is further arranged to reduce a voltage swing of the output-of-band part in the RF signal so as to prevent the RF signal processor from being saturated by the out-of-band part of the RF signal.

11. The receiver of claim 8, further comprising:
    a blocking circuit, coupled between the RF signal processor and the frequency conversion interface, for direct current (DC) blocking of the RF signal.

12. A receiver for a wireless communication system, comprising:
    a radio frequency (RF) signal processor, configured to provide an RF signal, comprising:
       a class-AB biased amplifier, arranged to apply amplification upon the RF signal; and
    a frequency conversion interface, coupled to the RF signal processor, for receiving the RF signal generated from the RF signal processor and generating a down-converted result of the RF signal,
    wherein the class-AB biased amplifier has an input port and an output port, and comprises:
    a first amplifier block, coupled to the input port, for receiving an input at the input port and generating a first output;
    a bias circuit, coupled to the first amplifier block and arranged to bias the first amplifier block for a class-AB operation; and
    a second amplifier block, coupled to the first amplifier block and the output port, for generating an output at the output port according to the first output.

13. The receiver of claim 12, wherein the first amplifier block comprises at least a transistor having a control terminal coupled to the bias circuit and thus biased by the bias circuit; and the transistor has an exponential current versus voltage characteristic.

14. The receiver of claim 13, wherein the transistor is a metal-oxide-semiconductor (MOS) transistor biased by the bias circuit to operate in a weak inversion region.

15. The receiver of claim 13, wherein the transistor is a bipolar junction transistor (BJT).

16. The receiver of claim 12, wherein the first amplifier block comprises at least a transistor having a control terminal coupled to the bias circuit and thus biased by the bias circuit; and a bias current passing through the transistor changes automatically in response to an input power level change, without any detection and feedback circuitry applied thereto.

17. The receiver of claim 16, wherein the transistor is a metal-oxide-semiconductor (MOS) transistor biased by the bias circuit to operate in a weak inversion region.

18. The receiver of claim 16, wherein the transistor is a bipolar junction transistor (BJT).

19. The receiver of claim 12, wherein the class-AB biased amplifier is a transconductance amplifier, and the frequency conversion interface is operated as a current driven interface to the RF signal processor for an output-of-band part of the RF signal.

20. The receiver of claim 19, wherein the frequency conversion interface is further arranged to reduce a voltage swing of the output-of-band part in the RF signal so as to prevent the RF processor from being saturated by the out-of-band part of the RF signal.

21. The receiver of claim 12, further comprising:
a blocking circuit, coupled between the RF signal processor and the frequency conversion interface, for direct current (DC) blocking of the RF signal.

\* \* \* \* \*